(12) United States Patent
Corkery

(10) Patent No.: US 9,146,443 B2
(45) Date of Patent: Sep. 29, 2015

(54) HIGH SPEED SOLID STATE OPTICAL SWITCHING SYSTEM USING BICONTINUOUS STRUCTURES

(71) Applicant: Robert William Corkery, Stockholm (SE)

(72) Inventor: Robert William Corkery, Stockholm (SE)

( * ) Notice: Subject to any disclaimer, the term of this patent is extended or adjusted under 35 U.S.C. 154(b) by 0 days.

(21) Appl. No.: 14/263,225

(22) Filed: Apr. 28, 2014

(65) Prior Publication Data

US 2015/0055209 A1 Feb. 26, 2015

Related U.S. Application Data

(63) Continuation-in-part of application No. 13/550,923, filed on Jul. 17, 2012, now abandoned.

(60) Provisional application No. 61/508,660, filed on Jul. 17, 2011, provisional application No. 61/547,184, filed on Oct. 14, 2011, provisional application No. 61/671,878, filed on Jul. 16, 2012.

(51) Int. Cl.
*G02F 1/29* (2006.01)
*G02B 26/08* (2006.01)
*G02B 5/10* (2006.01)
*G02B 6/35* (2006.01)

(52) U.S. Cl.
CPC .. *G02F 1/29* (2013.01); *G02B 5/10* (2013.01); *G02B 6/3512* (2013.01); *G02B 6/3556* (2013.01); *G02B 26/0841* (2013.01); *G02B 6/3502* (2013.01); *G02B 26/0816* (2013.01)

(58) Field of Classification Search
CPC ...... G02F 1/29; H05K 1/0212; H05K 1/0284; G02B 6/3512; G02B 6/3556; H04N 5/74
See application file for complete search history.

(56) References Cited

U.S. PATENT DOCUMENTS

| | | | | |
|---|---|---|---|---|
| 6,002,522 A | * | 12/1999 | Todori et al. | 359/573 |
| 8,043,520 B2 | * | 10/2011 | Asakawa et al. | 216/56 |
| 8,080,483 B2 | * | 12/2011 | Hillhouse et al. | 438/780 |
| 8,436,340 B2 | * | 5/2013 | Napolitano et al. | 257/40 |
| 2014/0087142 A1 | * | 3/2014 | Nealey et al. | 428/172 |

* cited by examiner

*Primary Examiner* — David N Spector
(74) *Attorney, Agent, or Firm* — Basch & Nickerson LLP

(57) ABSTRACT

A three-dimensional circuit includes a hyperbolic bicontinuous structure forming a substrate; circuits formed on a first surface of the hyperbolic bicontinuous structure; and electrically conductive traces formed between the circuits. The electrically conductive traces are formed two-dimensionally on the first surface of the hyperbolic bicontinuous structure. The electrically conductive traces are effectively three-dimensional traces between the circuits.

27 Claims, 31 Drawing Sheets

HIGH SPEED SOLID STATE OPTICAL SWITCHING SYSTEM USING BICONTINUOUS STRUCTURES

PRIORITY INFORMATION

This application is a continuation-in-part of U.S. patent application Ser. No. 13/550,923, filed on Jul. 17, 2012, now abandoned. This application claims priority, under 35 U.S.C. §120, from co-pending U.S. patent application Ser. No. 13/550,923, filed on Jul. 7, 2012, said co-pending U.S. patent application Ser. No. 13/550,923, filed on Jul. 17, 2012, claiming priority, under 35 U.S.C. §119(e), from U.S. Provisional Patent Application, Ser. No. 61/508,660, filed on Jul. 17, 2011; U.S. Provisional Patent Application, Ser. No. 61/547,184, filed on Oct. 14, 2011; and U.S. Provisional Patent Application, Ser. No. 61/671,878, filed on Jul. 16, 2012. The entire content of co-pending U.S. patent application Ser. No. 13/550,923, filed on Jul. 17, 2012, is hereby incorporated by reference.

This application claims priority, under 35 U.S.C. §119(e), from U.S. Provisional Patent Application, Ser. No. 61/508,660, filed on Jul. 17, 2011. The entire content of U.S. Provisional Patent Application, Ser. No. 61/508,660, filed on Jul. 17, 2011, is hereby incorporated by reference.

This application further claims priority, under 35 U.S.C. §119(e), from U.S. Provisional Patent Application, Ser. No. 61/547,184, filed on Oct. 14, 2011. The entire content of U.S. Provisional Patent Application, Ser. No. 61/547,184, filed on Oct. 14, 2011, is hereby incorporated by reference.

BACKGROUND

Light modulating mirror devices have been developed in which a mirror or reflector is can be positioned at various locations to either direct the impinging light to one location or to direct the impinging light to another location.

When a voltage is applied to one region housing the mirror, the mirror is moved so that the impinging light is directed to a first location. When the voltage is removed or applied to another region housing the mirror, the mirror is moved so that the impinging light is directed to a second location.

Such a device can be implemented in a variety of optical applications. For example, U.S. Pat. No. 5,061,049, issued on Oct. 29, 1991, entitled "Spatial Light Modulator and Method," describes a spatial light modulator with a movable mirror.

Spatial light modulators are transducers that modulate incident light in a spatial pattern corresponding to an electrical or optical input. The incident light may be modulated in its phase, intensity, polarization, or direction, and the light modulation may achieved by a variety of materials exhibiting various electrooptic or magnetoopotic effects and by materials that modulate light by surface deformation.

An example of a prior art single pixel electrostatic (rigid) movable mirror device is illustrated by FIG. 1. The pixel, generally denoted 20, is basically a plate (flap) covering a shallow well and includes silicon substrate 22, insulating spacer 24, metal hinge layer 26, metal plate layer 28, plate 30 formed in layers 26-28, and plasma etch access holes 32 in plate 30. The portions 34 & 36 of hinge layer 26 that are not covered by plate layer 28 form torsion hinges (torsion rods) attaching beam 30 to the portion of layers 26-28 supported by spacer 24. Electrodes 40, 42, 46, and 41 run between spacer 24 and substrate 22 and are isolated from substrate 22 by silicon dioxide layer 44.

The design of FIG. 1 allows that the plate metal be as thick as desired and the hinge metal be as thin as desired without the problems of step coverage of the hinge metal over the plate metal and that the spacer surface under the beam metal is not exposed to processing side effects which would arise if the hinge were formed as a rectangular piece on the spacer prior to deposition of the plate metal.

Pixel 20 is operated by applying a voltage between metal layers 26-28 and electrodes 42 or 46 on substrate 22: beam 30 and the electrodes form the two plates of an air gap capacitor and the opposite charges induced on the two plates by the applied voltage exert electrostatic force attracting beam 30 to substrate 22, whereas electrodes 40 and 41 are held at the same voltage as beam 30. This attractive force causes beam 30 to twist at hinges 34 and 36 and be deflected towards substrate 22.

FIG. 1 also indicates the reflection of light from deflected beam 30 as may occur during operation of a deformable mirror device. The deflection of beam 30 can be a highly non-linear function of the applied voltage because the restoring force generated by the twisting of hinge 34 is approximately a linear function of the deflection but the electrostatic force of attraction increases as a function of the reciprocal of the distance between the closest corner of beam 30 and substrate 22.

Conventional optical switches provide single path switching for single lasers or single beam of light.

Therefore, it is desirable to provide an optical switching system that is capable of multiple sub-pathway switching without negatively impacting the switching speed. Furthermore, it is desirable to provide an optical switching system that is capable of handling multiple lasers or beams of light without negatively impacting the switching speed.

It is noted that higher integration of semiconductor devices is desired for superior performance and/or reducing the price of electronic devices.

Accordingly, three-dimensional semiconductor devices having a stacked structure have been fabricated, wherein the stacked structure includes a first layer, a second layer, a third layer, and a fourth layer sequentially stacked on a substrate. An example of such a structure is illustrated in FIG. 29.

In FIG. 29, a first layer 2110 is formed. Upon the first layer 2110, circuits 2205 and 2210 are formed. In this example, circuits 2205 and 2210 are formed on the same plane of layer 2110. Wiring or conductive traces 2310 are formed between circuits 2205 and 2210.

Upon first layer 2110, a second layer 2120 is formed. It is noted that an air gap may be formed between first layer 2110 and second layer 2120.

Upon the second layer 2120, circuits 2215 and 2220 are formed. In this example, circuits 2215 and 2220 are formed on the same plane of layer 2120. Wiring or conductive traces 2325 are formed between circuits 2215 and 2220.

Upon second layer 2120, a third layer 2130 is formed. It is noted that an air gap may be formed between second layer 2120 and third layer 2135.

Upon the third layer 2130, circuits 2225, 2230, and 2235 are formed. In this example, circuits 2225, 2230, and 2235 are formed on the same plane of layer 2130. Wiring or conductive traces 2340 and 2345 are formed between circuits 2225, 2230, and 2235.

Upon third layer 2130, a fourth layer 2140 is formed. It is noted that an air gap may be formed between third layer 2130 and fourth layer 2140.

Upon the fourth layer 2140, circuits 2240, 2245 and 2250 are formed. In this example, circuits 2240, 2245, and 2250 are formed on the same plane of layer 2140. Wiring or conductive traces 2360 and 2365 are formed between circuits 2240, 2245, and 2250.

To provide electrical connectivity between layers, wiring or conductive traces 2425 and 2475 are vertically formed between layers 2110, 2120, 2130, and 2140. Wiring or conductive traces 2305, 2315, 2320, 2330, 2335, 2350, 2355, and 2370 are formed to provide electrical connectivity between the various circuits and vertical conductive traces 2425 and 2475.

It is noted that wiring or conductive traces 2425 and 2475 may be integral with wiring or conductive traces 2305, 2315, 2320, 2330, 2335, 2350, 2355, and 2370.

Another example of a stacked structure is disclosed in Published US Patent Application Number 2012/0171861. The entire content of Published US Patent Application Number 2012/0171861 is hereby incorporated by reference.

In these conventional devices, the conductive traces that provide connectivity between levels or layers include 90 degree bends. These 90 degree bends can produce heat, consume power, and radiate noise.

Moreover, it is desirable to provide a three-dimensional circuit architecture that realizes less heat, less power consumption, optimally shorter paths, and higher connectivity options.

Furthermore, it is desirable to have a three dimensional circuit or device that is confined to a two dimensional substrate.

BRIEF DESCRIPTION OF THE DRAWINGS

The drawings are only for purposes of illustrating embodiments and are not to be construed as limiting, wherein.

DETAILED DESCRIPTION

Figure 1:
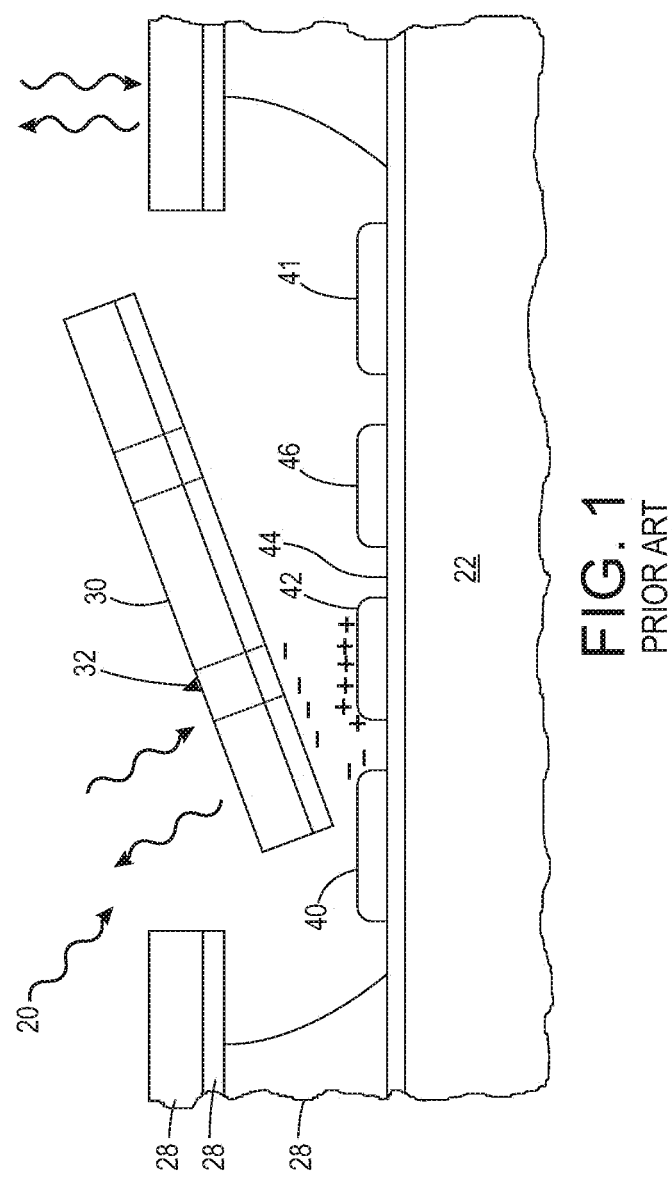
FIG. 1 illustrates single pixel electrostatic (rigid) movable mirror device.

For a general understanding, reference is made to the drawings. In the drawings, like reference have been used throughout to designate identical or equivalent elements. It is also noted that the various drawings may not have been drawn to scale and that certain regions may have been purposely drawn disproportionately so that the features and concepts could be properly illustrated.

As discussed above, it is desirable to provide an optical switching system that is capable of multiple sub-pathways switching without negatively impacting the switching speed. Furthermore, it is desirable to provide an optical switching system that is capable of handling multiple lasers or beams of light without negatively impacting the switching speed. An example of such an optical switching system is illustrated in FIG. 2.

Figure 2:
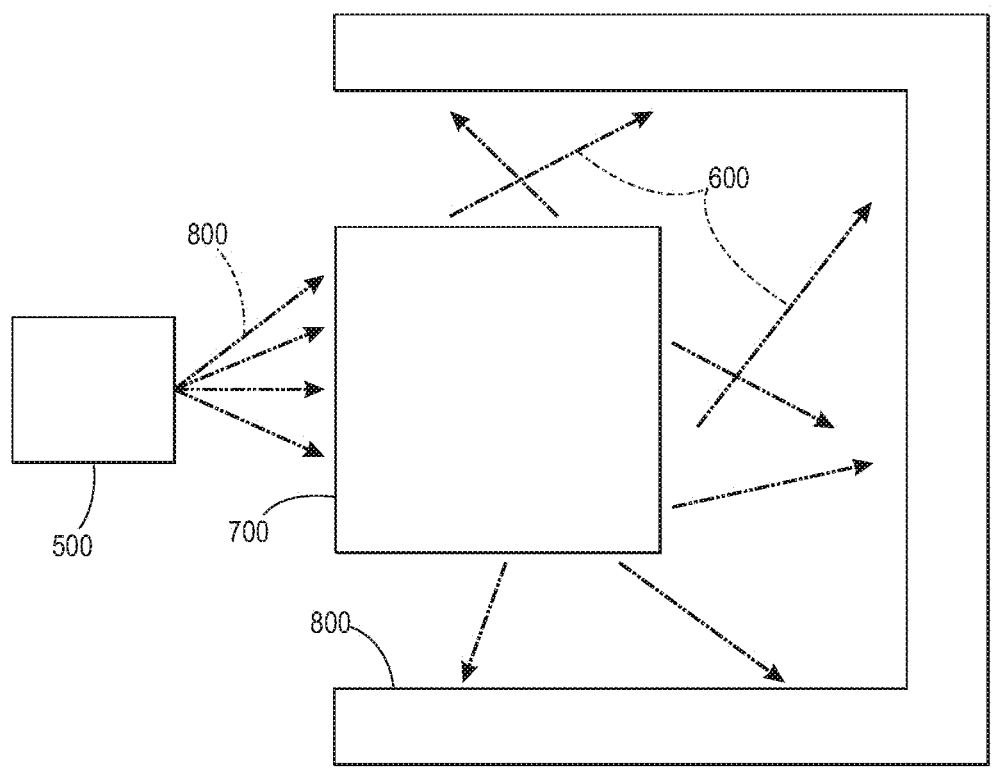
FIG. 2 illustrates a block diagram of an optical switching system using a bicontinuous structure.

As illustrated in FIG. 2, a laser source 500 provides a single laser whose primary photons can be directed in multiple directions, as illustrated by any one of the dashed line arrows 550. The laser 550 is inputted into a bicontinuous optical switching structure 700, at a predetermined point of entry and trajectory.

The primary optical path though the structure 700 is defined by pure geometric optics; i.e., the angle of incidence and angle of reflection are identical for photons incident on any surface encountered. The primary path is defined only for 100% reflective perfectly smooth surfaces, and is not subject to deviations due to scattering diffraction and other optical phenomena.

Primary photons are defined as photons that travel on the primary path. The primary optical exit is the exit that primary photons take after following the primary optical path.

Secondary photons are defined as those photons that travel on paths other than the primary path and exit at points and angles different from that of the primary photons. Photons from the laser travel through the bicontinuous optical switching structure 700. Photons from the laser 600 exits a primary exit point depending upon the predetermined point of entry and/or angle. The exiting primary or secondary photons can be collected by a device or devices 800 for sensing, illumination, heating, further transmission, processing, and/or modulation, etc.

The bicontinuous optical switching structure 700 is an optical switching system that includes a large number of switching channels. The switching channels are all optical and do not impede signal transmission.

As noted above, the optical switch comprises complex bicontinuous structures formed of bicontinuous surfaces. Examples of bicontinuous surfaces are bicontinuous minimal surfaces, such as the gyroid (the D and the P surfaces). Such bicontinuous surfaces are well known to those skilled in the art.

The bicontinuous structures are characterized by mutually interpenetrating labyrinths and contain a hyperbolically curved interface.

It is noted that the term hyperbolic refers only to the curvature at a point. The average curvature of the surface extended to infinity could indicate that the overall average surface curvature is hyperbolic.

It is noted that there may be some flat points and points of positive Gaussian curvature in the structures, but on average each point has a hyperbolic curvature; i.e., the two principle curvatures at a point are of opposite signs, and thus, the product thereof or Gaussian curvature is negative.

The bicontinuous optical switching structure 700 includes a predetermined arrangement tunnels which can be coated with a reflective material or ground or polished to a very smooth surface to provide the desired reflective properties.

The tunnels can provide pathways from points on the exterior bounding surface of the bicontinuous structure via one or a series of reflections through the three-dimensional bicontinuous optical switching structure 700 to a second set of points at another location on the exterior of the bicontinuous structure. It is noted that both of the tunnel labyrinths are continuous from one side of the bicontinuous structure to the other because of the multiple branched connections each tunnel has. The tunnel branching provides a greater number of the multiple exit points in a three-dimensional space than if the tunnels did not contain branch points.

Each open tunnel entrance on the exterior of a bicontinuous structure contains a plurality of potential optical entry points. Each potential optical entry point may be a physical location on one or the other side of the bicontinuous structure.

The distribution of curvature in the structure can vary. In the most homogeneous case, the surface is called the gyroid. Other known surfaces have more curvature variation. The mean curvature at each point can be constant or close to constant. These are the set of mean curvature surfaces.

It is further noted that, with respect to a bicontinuous surface, a light beam enters one set of branched tunnels at a point and exits from the same set of branched tunnels. Thus, there are in fact two sets of possible inputs and outputs, unless punctures are placed in the surface to allow photons to travel to the other side. A single puncture means the surface no longer defines a set of separate tunnel labyrinths since the tunnels are now connected. Thus, the system is no longer formally bicontinuous.

In addition to bicontinuous surfaces, the optical switch may be formed of tricontinuous surfaces and multi-continuous surfaces in which multiple sets of tunnel systems are separated by a single surface. In these cases, there will be multiple sets of unconnected branching tunnel networks within the structure. These can also be of high and low symmetry, high and low degree of periodic order and with and without punctures.

It is noted that the optical switch may be formed of nested sets of bicontinuous surfaces.

In addition, it is noted that the optical switch may be formed of bicontinuous or multi-continuous surfaces, and variations thereof, in combination with any other surface either on the inside or outside of the structure. For example, a bicontinuous surface may be utilized with a sphere in a tunnel.

In addition, each potential optical entry point for a tunnel may correspond to a different angle of incidence at a single physical location on the bicontinuous structure.

Furthermore, each potential optical entry point may be a physical location on the bicontinuous structure and each potential optical entry point may correspond to a different angle of incidence at the physical location on the bicontinuous structure such that the multiple potential optical entry points form a three-dimensional set of potential optical entry points for each tunnel.

Depending upon the entry point and the entry angle, photons from the entering light beam will exit as primary photons at a precise point from the bicontinuous optical switching structure 700 defined by the primary optical path. In other words, the angle of entry and the entry point (assuming multiple entry points) dictates the position and angle of the exiting light beam or photons at the primary exit point.

It is further noted that each entry point may have several output points if, for example, the photon splits in two or for any other reason that causes the path to deviate from the geometrically defined primary path. These are defined as secondary photons. Secondary photons are defined as those that travel along paths other than the primary path and exit from points other than primary exit points and in directions other than the primary trajectories (angles) along from the bicontinuous structure. Secondary photons thus have secondary paths, exit at secondary points and have secondary exit trajectories.

Based upon these dependencies, the entry points and corresponding exit points of a particular bicontinuous optical switching structure can be precisely mapped.

Moreover, since the physical location of the incident beam and the angle of incidence (entrance trajectory) dictate the primary exit point, a single tunnel can represent multiple entry/exit point pairs. Thus, a single tunnel can provide a multitude of sub-pathways in either tunnel system for multiple beams without the beams impeding each other.

Examples of a single laser beam entering a tunnel at different angles of entry are illustrated in FIGS. 3 through 6.

Figure 3:
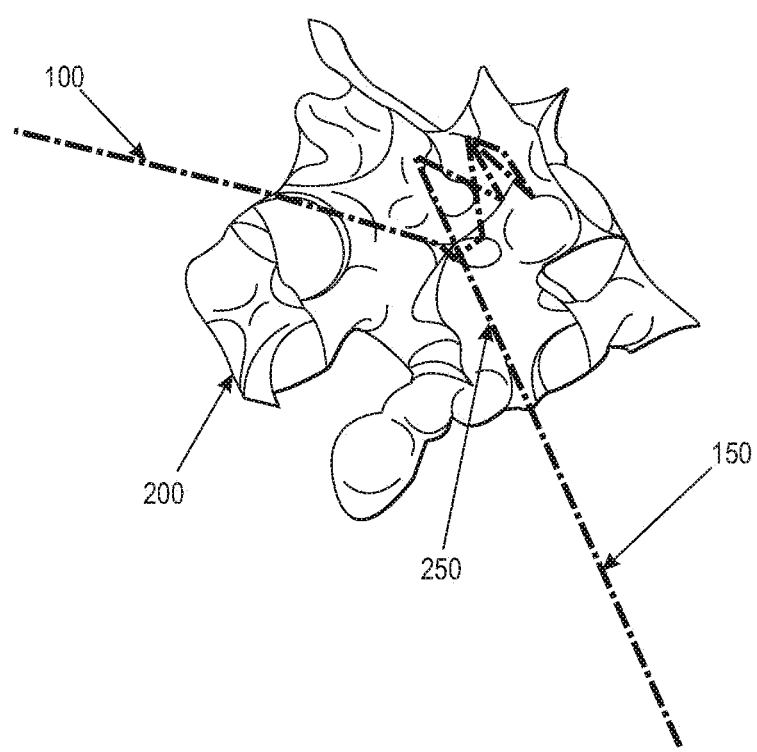
FIG. 3 illustrates an example of a bicontinuous optical switching structure directing primary photons originating from a green laser in a predetermined direction.

As illustrated in FIG. 3, a laser 100 enters a tunnel of the bicontinuous optical switching structure 200 at a certain angle. Based upon this angle of entry and the corresponding tunnel, the photons 150 exit from the bicontinuous optical switching structure 200 at a certain exit point 250.

Figure 4:
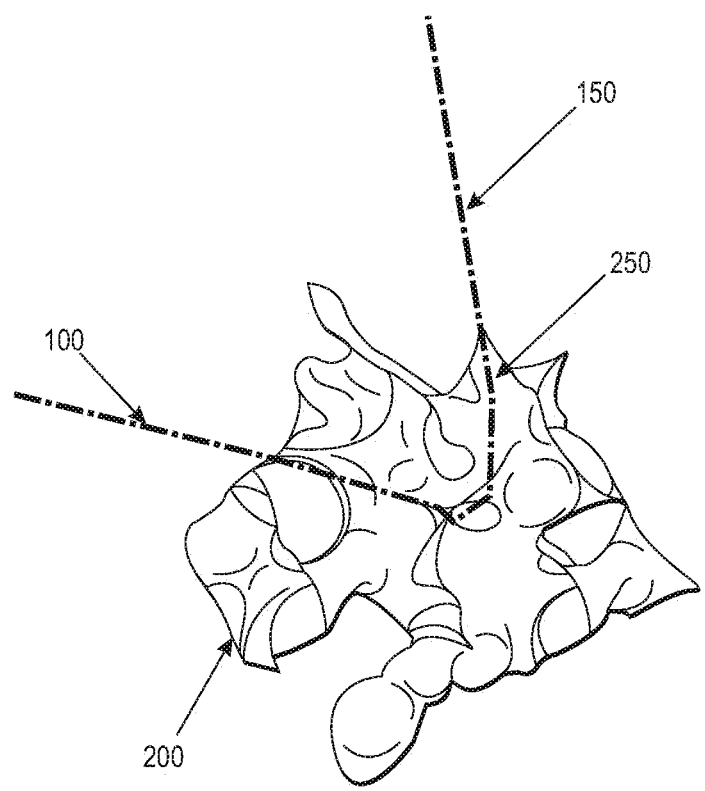
FIG. 4 illustrates another example of a bicontinuous optical switching structure directing primary photons originating from a green laser in a predetermined direction.

As illustrated in FIG. 4, a laser 100 enters the same tunnel of the bicontinuous optical switching structure 200 but a different angle. Based upon this different angle of entry, the photons 150 exits from the bicontinuous optical switching structure 200 at a different exit point 250.

Figure 5:
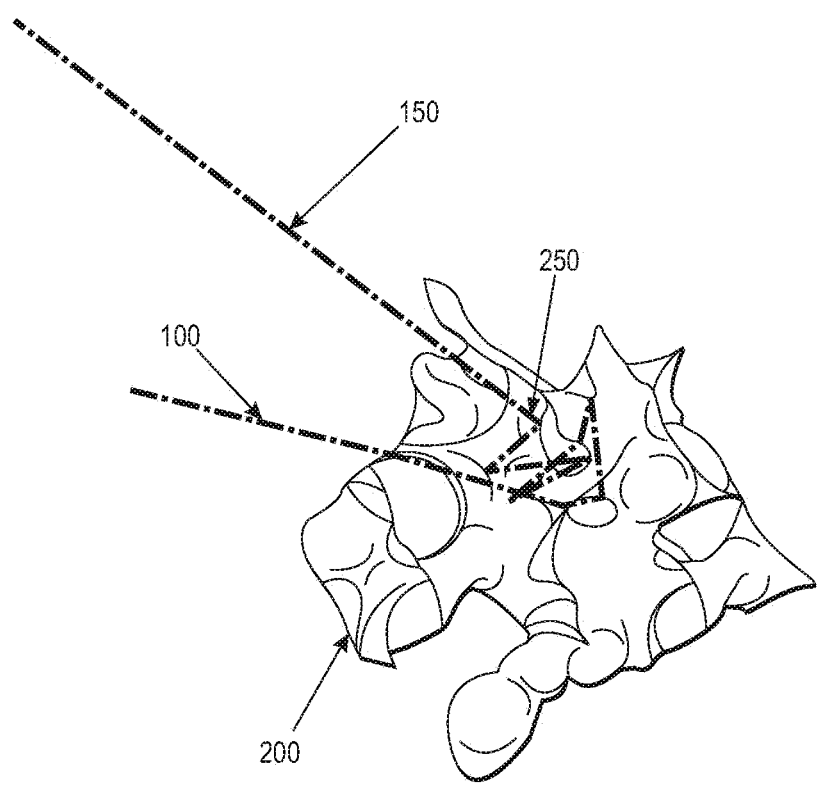
FIG. 5 illustrates a third example of a bicontinuous optical switching structure directing primary photons originating from a green laser in a predetermined direction.

As illustrated in FIG. 5, photons 100 enter the same tunnel of the bicontinuous optical switching structure 200 but an angle different from the angles of FIGS. 3 and 4. Based upon this different angle of entry, the primary photons 150 exit from the bicontinuous optical switching structure 200 at still another different exit point 250.

Figure 6:
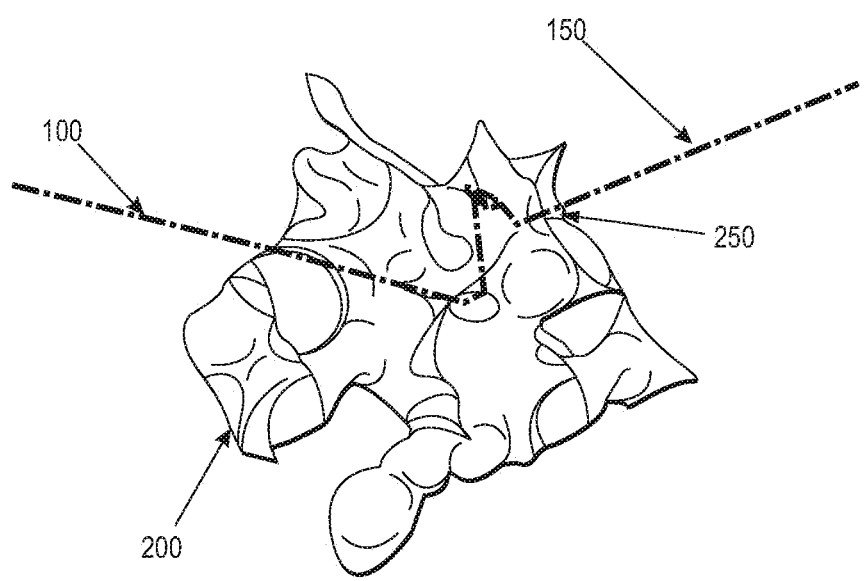
FIG. 6 illustrates a fourth example of a bicontinuous optical switching structure directing primary photons originating from a green laser in a predetermined direction.

As illustrated in FIG. 6, a laser 100 enters the same tunnel of the bicontinuous optical switching structure 200 but an angle different from the angles of FIGS. 3, 4, and 5. Based upon this different angle of entry, the primary photons 150 exit from the bicontinuous optical switching structure 200 at still another different exit point 250.

As previously stated, by directing the laser at different angles of entry, a mapping of the exit points to entry points can be generated so as to provide an effective switching device.

Figure 7:
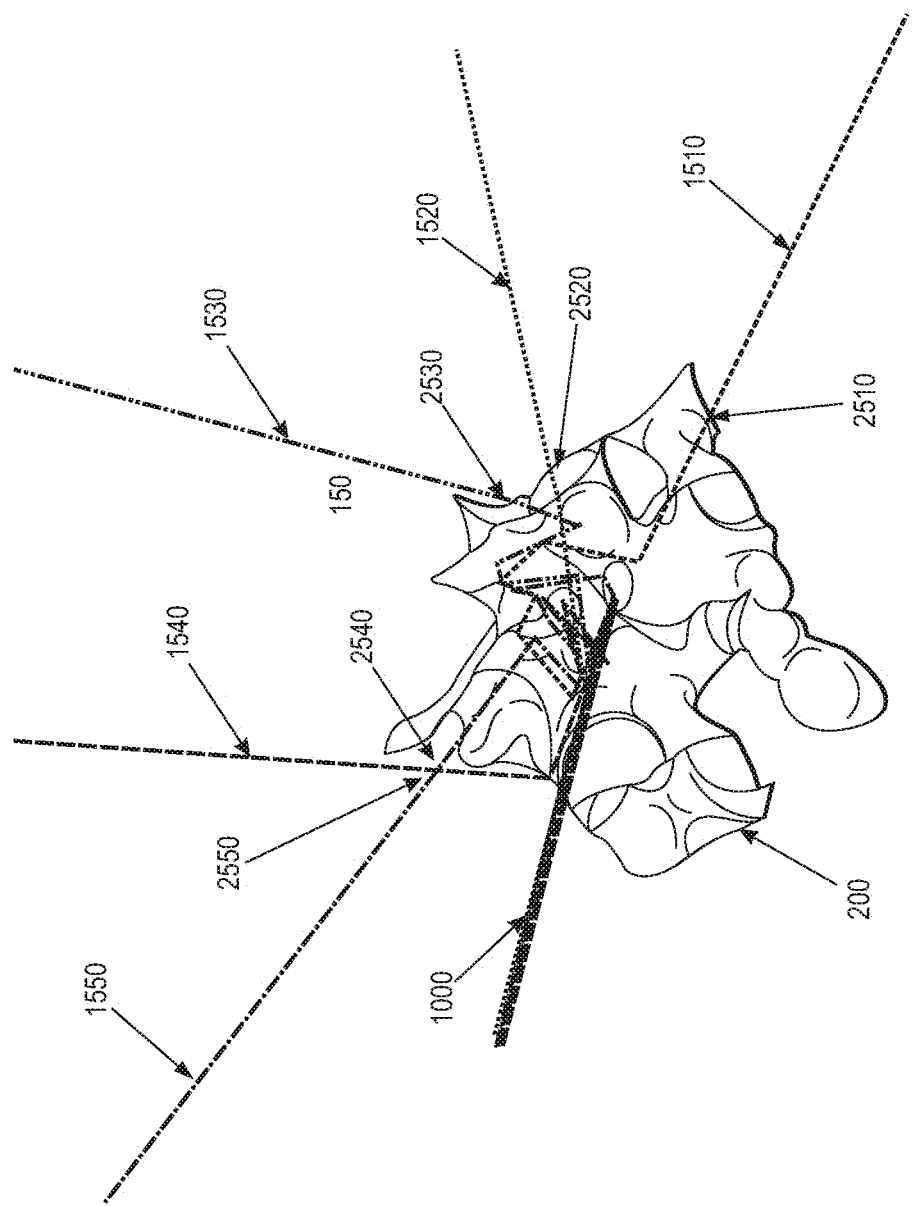
FIG. 7 illustrates an example of a bicontinuous optical switching structure directing primary photons originating from multiple lasers in different predetermined directions.
Figure 8:
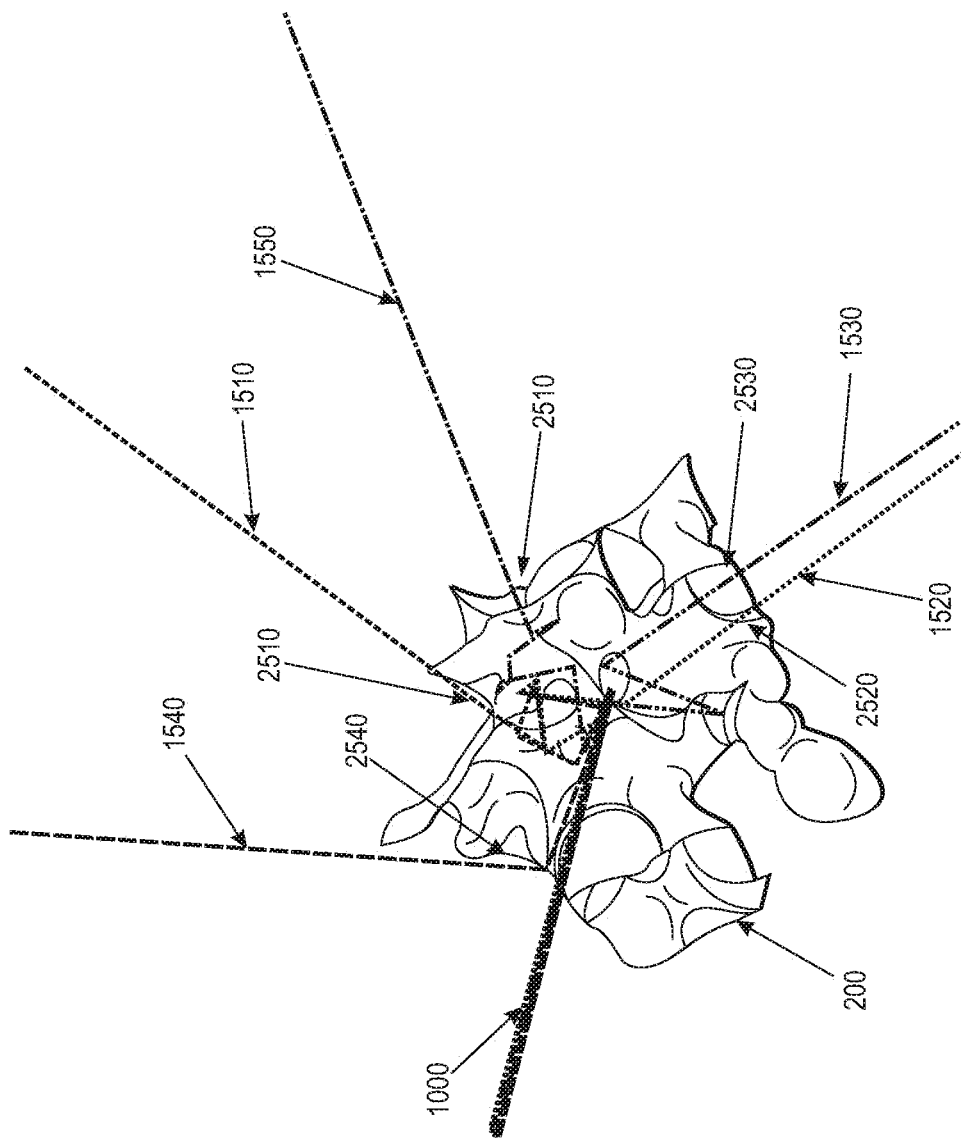
FIG. 8 illustrates another example of a bicontinuous optical switching structure directing primary photons originating from multiple lasers in different predetermined directions.
Figure 9:
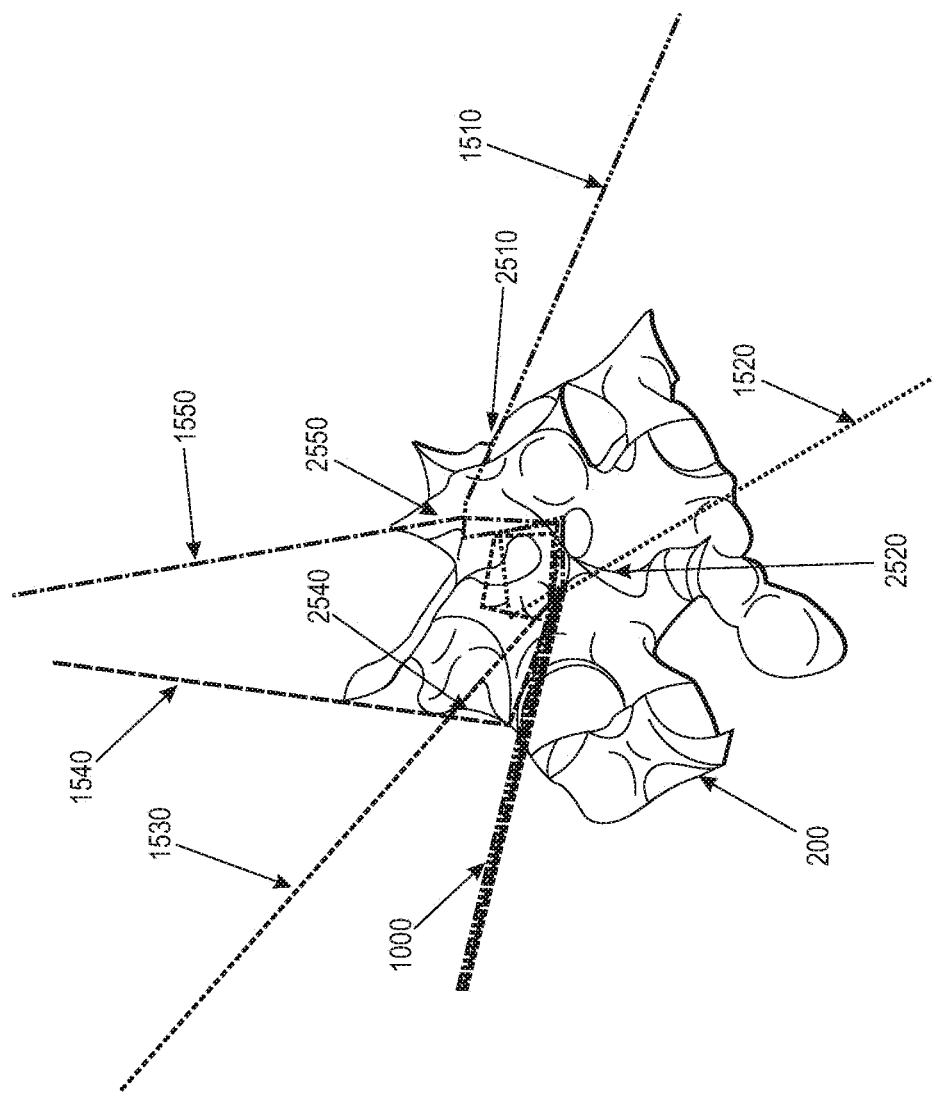
FIG. 9 illustrates a third example of a bicontinuous optical switching structure directing primary photons originating from multiple lasers in different predetermined directions.

Examples of multiple laser beams entering a tunnel at different angles of entry are illustrated in FIGS. 7 through 9.

As illustrated in FIG. 7, multiple laser beams 1000 enter the same tunnel of the bicontinuous optical switching structure 200, but each at a different point on the surface. Based upon these different points of entry, the primary photons (1510, 1520, 1530, 1540, and 1550) exit from the bicontinuous optical switching structure 200 at different points and trajectories (2510, 2520, 2530, 2540, and 2550), respectively.

As illustrated in FIG. 8, multiple laser beams 1000 enter the same tunnel of the bicontinuous optical switching structure 200, but each at a different point and different from the angles illustrated in FIG. 7. Based upon these different angles of entry, the primary photons (1510, 1520, 1530, 1540, and 1550) exit from the bicontinuous optical switching structure 200 at different points (2510, 2520, 2530, 2540, and 2550) and trajectories, respectively.

As illustrated in FIG. 9, multiple laser beams 1000 enter the same tunnel of the bicontinuous optical switching structure 200, but each at a different angle and different from the angles illustrated in FIGS. 7 and 8. Based upon these different angles of entry, the primary photons (1510, 1520, 1530, 1540, and 1550) exit from the bicontinuous optical switching structure 200 at different points (2510, 2520, 2530, 2540, and 2550) and trajectories, respectively.

It is noted that although the Figures show the laser entering one side of the bicontinuous optical switching structure 200, the laser can enter any tunnel around the bicontinuous optical switching structure 200. In all the various possibilities of entry points, the exit point of the primary photons is dictated by the entry point and angle of entry and can be readily measured and mapped.

The bicontinuous optical switching structure allows each tunnel to have a large number of sub-pathways.

It is noted that the entry point and angle of entry can be controlled by a MEMS mirror system or an optical deflection device. Moreover, the entry point and angle of entry can be set by the positioning of the laser source or fiber optic or light channel carrying the light beam.

It is further noted that the angular pathways within the tunnel(s) create a form of switching identification (entry/exit point pair) that is incremental to the information within the beam.

Moreover, a second bicontinuous optical switching structure can be added (stacked) to the first bicontinuous optical switching structure, by mating the tunnel entrance (exit) of one bicontinuous optical switching structure to the tunnel exit (entrance) of the other bicontinuous optical switching structure, to increase selectivity.

Control of the beams and their respective angle of entry can be realized by deflecting the laser beam from its source to the entrance to the tunnel. There are many forms of modulation of lasers, such as a MEMS mirror system wherein the mirrors can be manipulated to be ON/OFF or have a particular angle of deflection.

The entry point of a laser beam can be mapped to its measured exit point (of its primary photons) such that the bicontinuous optical switching structure can be used to route the laser beam to another switch, to a cable, a fiber optic, to an optical storage device, a signal modulator, and/or other optical components.

In addition to deflection, modulation of the beam and/or color can be used to modify the incoming beam for mapping to an output primary photon beam. Moreover, using interference patterns and/or other forms of adaptation to the beams to mix with parts of the beam can be utilized in providing identification for mapping purposes.

As FIGS. 3-9 illustrate, the beam selectivity is largest when the beam hits certain critical points on the surface at certain angles such that a small shift in the angle results in a large change in output path. A multitude of these critical points exists on the surface of the hyperbolic bicontinuous structures, depending on the intrinsic surface curvature of the hyperbolic bicontinuous structures and orientation of the hyperbolic bicontinuous structures to the beam. If the beam hits several of these critical points consecutively, the number of possible outputs exponentially rises.

Based upon the characteristics of these critical points, a beam can be aimed close to, but not quite exactly on the critical point, to effect very quick switching, thereby increasing the range of possible paths through the hyperbolic bicontinuous structures. This allows the optical switch to effectively operate at the edge of chaos.

Regarding the entry angles of the light entering the optical switch, there are basically three situations involving directing the initial light source and keeping the mirror fixed: (1) when the light source is outside the bounding volume of the surface; (2) when the light source comes from within the free space of the bounded surface and (3) when the light source is embedded in the surface.

For these situations, mirrors (planar or curved) may be used to change the incident angle relative to the bicontinuous mirror. This would only require extremely small motions to change the incoming direction of the light (flexible or not).

Moreover, lenses, prisms, gratings, beam splitters, waveguides, tunable non-linear optical devices, or responsive optical elements that change shape/orientation, etc. may be used to achieve different incident angles.

For example, a non-linear waveguide that uses light from a different signal to change its optical properties, e.g., refractive index can be used. In this example, a pulsed control laser incident on a non-linear crystal, wherein the optical properties vary with the frequency of the pulse. In addition, a second laser containing information to be switched between two channels by changing its angle of incidence relative to the bicontinuous mirror is added. If the information is coded at a certain frequency, the control beam could change the way the waveguide directs the information and can then act as an optical switch. This could be amplitude gated or other variations.

Figure 10:
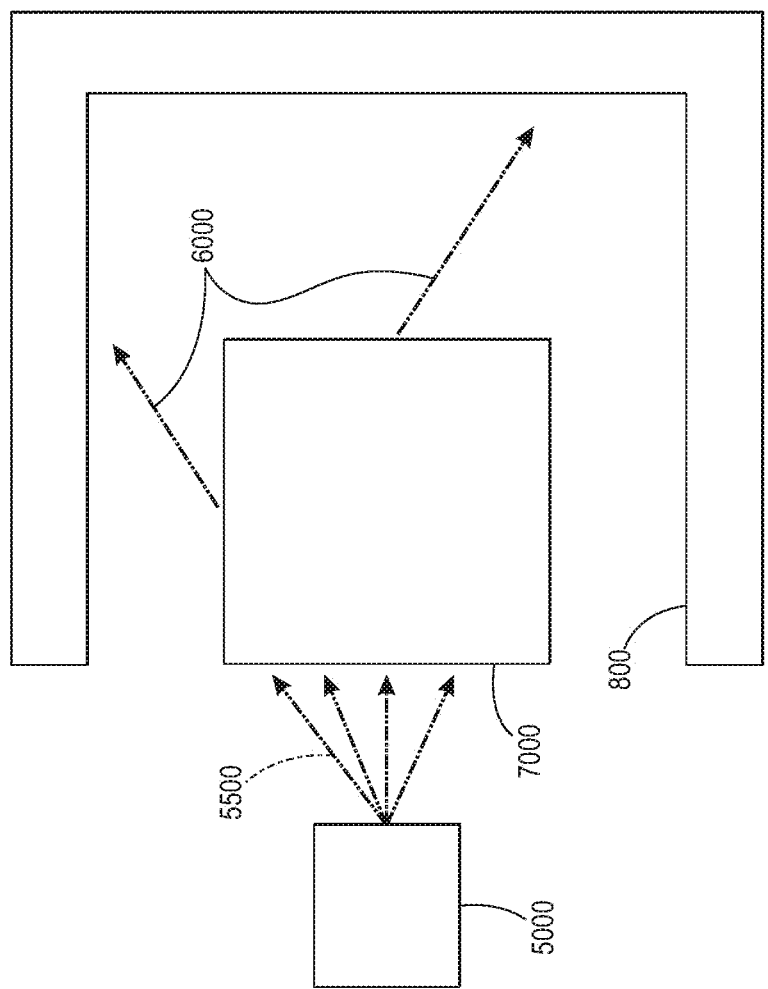
FIG. 10 illustrates a block diagram of an optical switching system using a bicontinuous structure and embedded electronic devices in or on the hyperbolic internal structures.

As illustrated in FIG. 10, a laser source 5000 provides a single laser which can be deflected (directed) in multiple directions, as illustrated by the dashed line arrow 5500. The laser 5500 is inputted into a bicontinuous optical switching structure 7000, at a predetermined point of entry or angle.

Within the bicontinuous optical switching structure 7000, active electronic circuits, such as laser diodes may be embedded on the hyperbolic surface of the bicontinuous structure such that when the laser 5500 hits the embedded laser diode, the laser diode is activated. Thus, the single laser 5500 can produce output signals 6000.

The exiting lasers 6000 can be collected by a device 800 for sensing, further transmission, processing, and/or modulation, etc.

Figure 11:
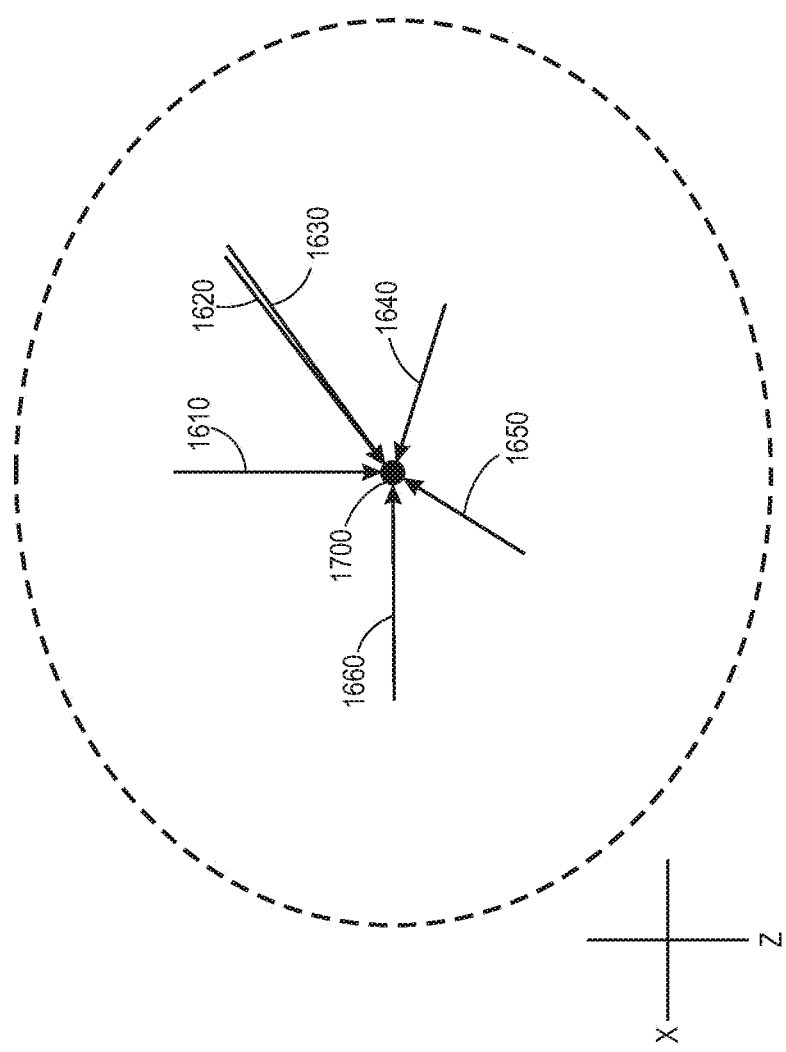
FIG. 11 shows an entry angle or trajectory of laser beams entering the opening of a tunnel of a bicontinuous structure from a perspective of looking into the entrance of the tunnel.

FIG. 11 illustrates possible angles of entry for a laser beam (1610, 1620, 1630, 1640, and 1650) at an entry point 1700. As illustrated in FIG. 11, the Figure shows the X-Y plane looking down upon the face of a tunnel opening in a bicontinuous structure.

It is noted that, in this example, potential laser beams 1620 and 1630 follow the same X-Y projection but start from different elevation in the Z direction. In other words, the starting point for laser beam 1620 is $(X,Y,Z_1)$ XYZ space, whereas the starting point for laser beam 1630 is $(X,Y,Z_2)$ in XYZ space.

Figure 12:
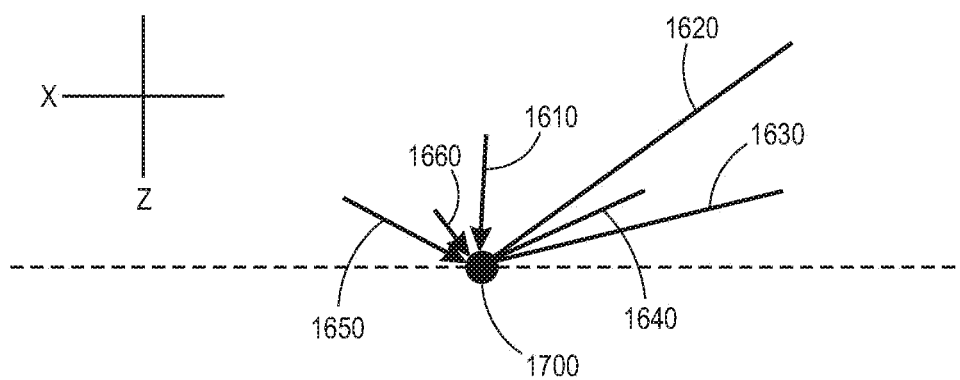
FIG. 12 shows an entry angle or trajectory of laser beams entering the opening of a tunnel of a bicontinuous structure from a perspective of looking across the face of the entrance of the tunnel.

FIG. 12 illustrates possible angles of entry for a laser beam (1610, 1620, 1630, 1640, and 1650) at an entry point 1700. As illustrated in FIG. 12, the Figure shows the X-Z plane across the face of a tunnel opening in a bicontinuous structure.

It is noted that, in this example, potential laser beams 1620 and 1630 lie in the same X-Y plane but start from different points in the Z direction.

It is noted that the hyperbolic bicontinuous structures within the switching device may be coated electro-optic coatings; such as Bragg mirrors that contain periodically spaced layers of non-linear optical materials; that change reflective properties in response to certain light characteristics.

It is further noted that the electro-optic coatings may be elements that interact with photons, such as a lens, diffraction grating, prisms, mirrors, lasers, photodiode, photovoltaic cell, etc.

It is also noted that the incident light may be photons in the visible spectrum or UV or IR parts of the electromagnetic spectrum.

As noted above, the predictability of entry and exit beam pairs is dependent on the pathway through the hyperbolic bicontinuous structures and this pathway may be changed by local or global induced distortions of the pathway, for example using heating or other methods.

Figure 13:
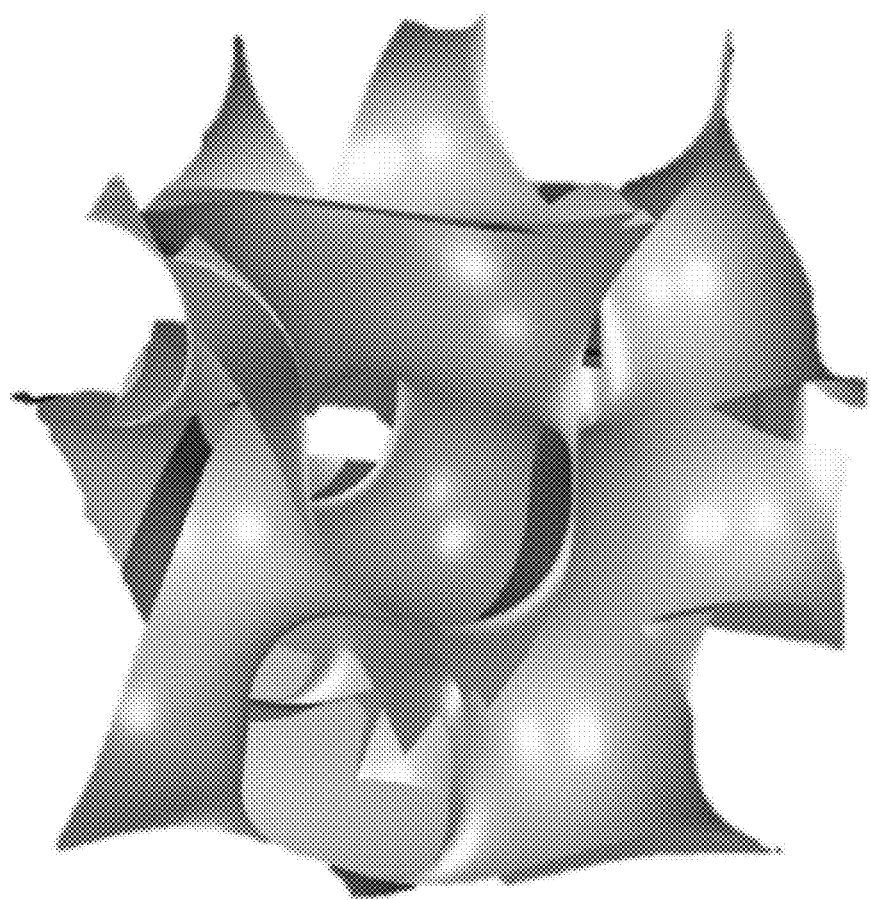
FIG. 13 shows an example of a device having multiple points with hyperbolic curvature, forming a single bicontinuous structure having an oriented, two-sided surface separating congruent and mutually interpenetrating tunnel labyrinths.

FIG. 13 illustrates an example of a device having a hyperbolic bicontinuous structure forming mutually interpenetrating labyrinths.

Figure 14:
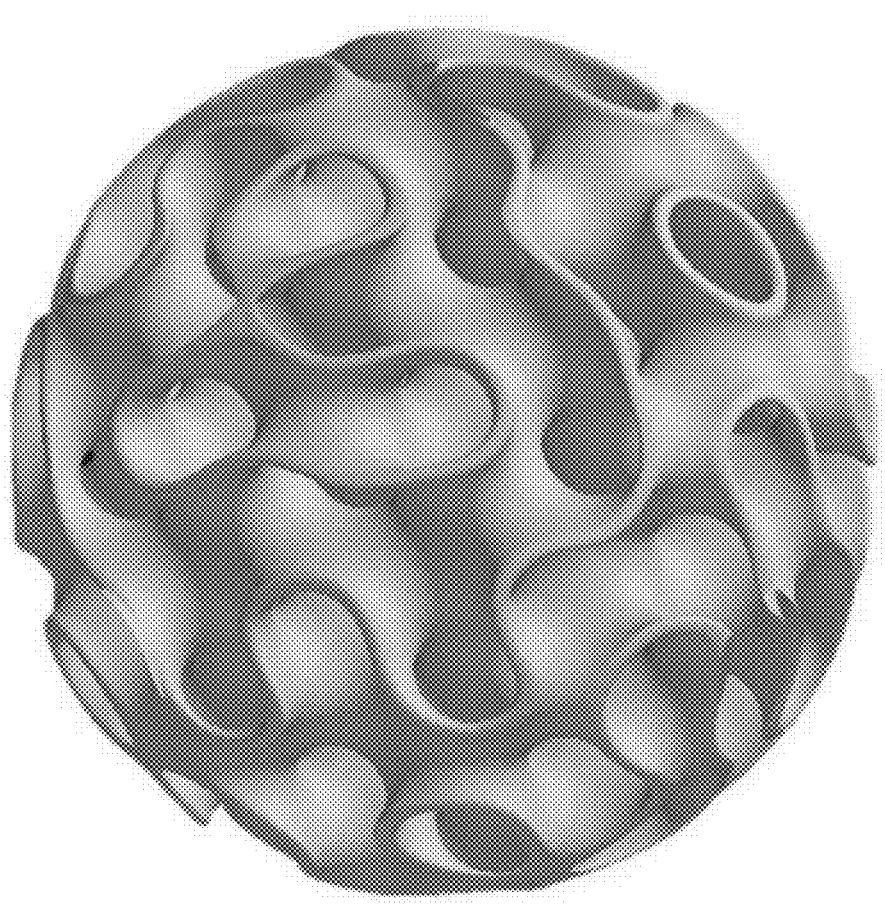
FIG. 14 shows another example of a device having multiple points with hyperbolic curvature, forming a single bicontinuous structure comprising an oriented, two-sided surface separating congruent and mutually interpenetrating tunnel labyrinths.

FIG. 14 illustrates another example of a device having a hyperbolic bicontinuous structure forming mutually interpenetrating labyrinths.

Figure 15:
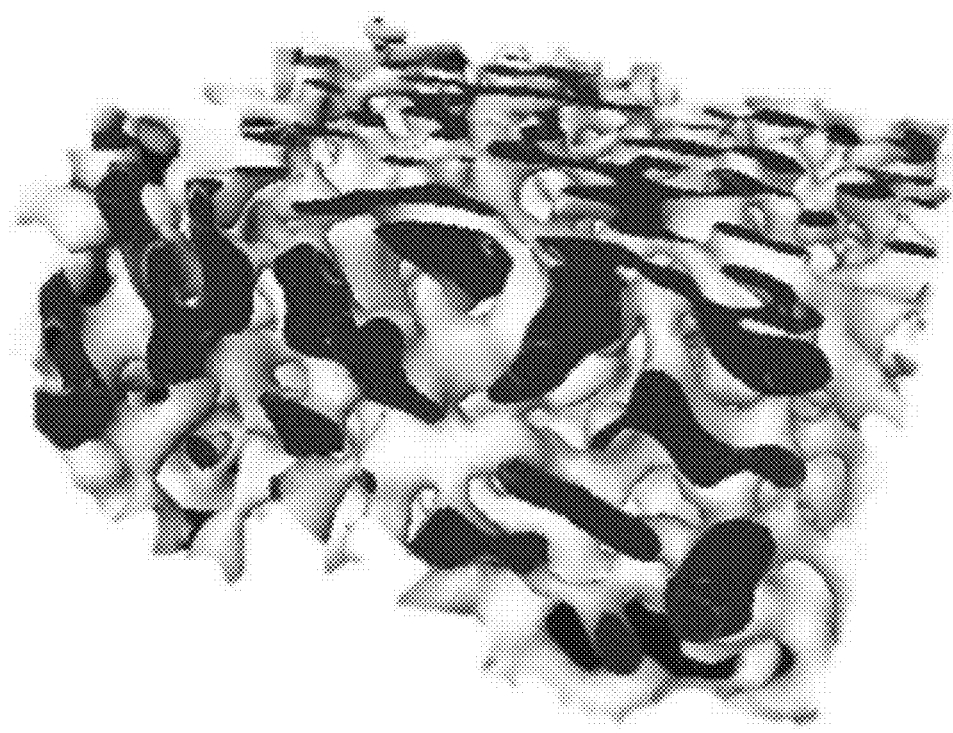
FIG. 15 shows a third example of a device having multiple points with hyperbolic curvature, forming a single bicontinuous structure comprising an oriented, two-sided surface separating congruent and mutually interpenetrating tunnel labyrinths; In this case the structure is random with no repeating motifs, whereas in FIGS. 13 and 14 the structures can be repeated infinitely in 3 dimensions using crystallographic symmetry operations.

FIG. 15 illustrates a third example of a device having a random bicontinuous structure forming mutually interpenetrating labyrinths.

It is noted that the bicontinuous or polycontinuous structures and variations thereof may have one set of tunnels closed in order to eliminate any edges. Examples of such structures are illustrated in FIGS. 16 and 17.

Figure 16:
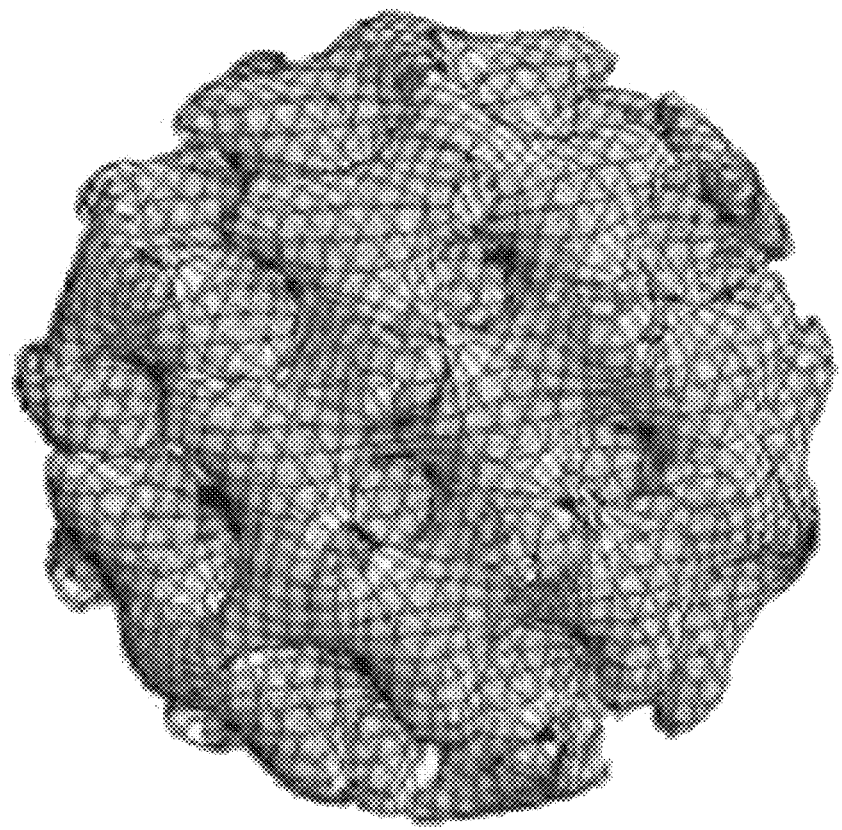
FIG. 16 shows an example of a bicontinuous structure where one of the two sets of tunnels has been closed by ellipsoidal caps.

FIG. 16 illustrates a D-surface cubosome closed by a sphere.

Figure 17:
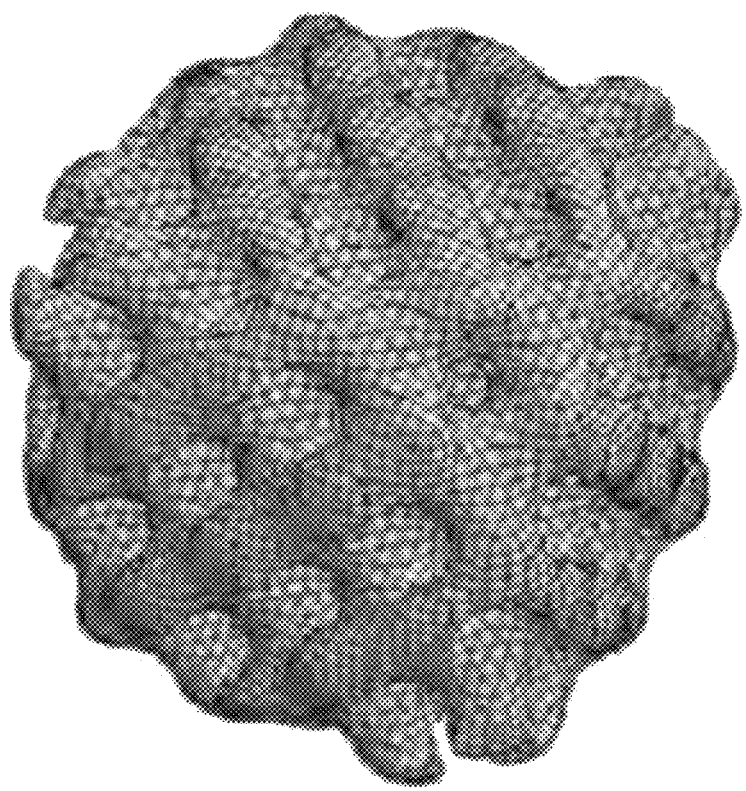
FIG. 17 illustrates a second bicontinuous structure where one of the two sets of tunnels has been closed by ellipsoidal caps.

FIG. 17 illustrates a D-surface cubosome closed by a cube.

Figure 18:
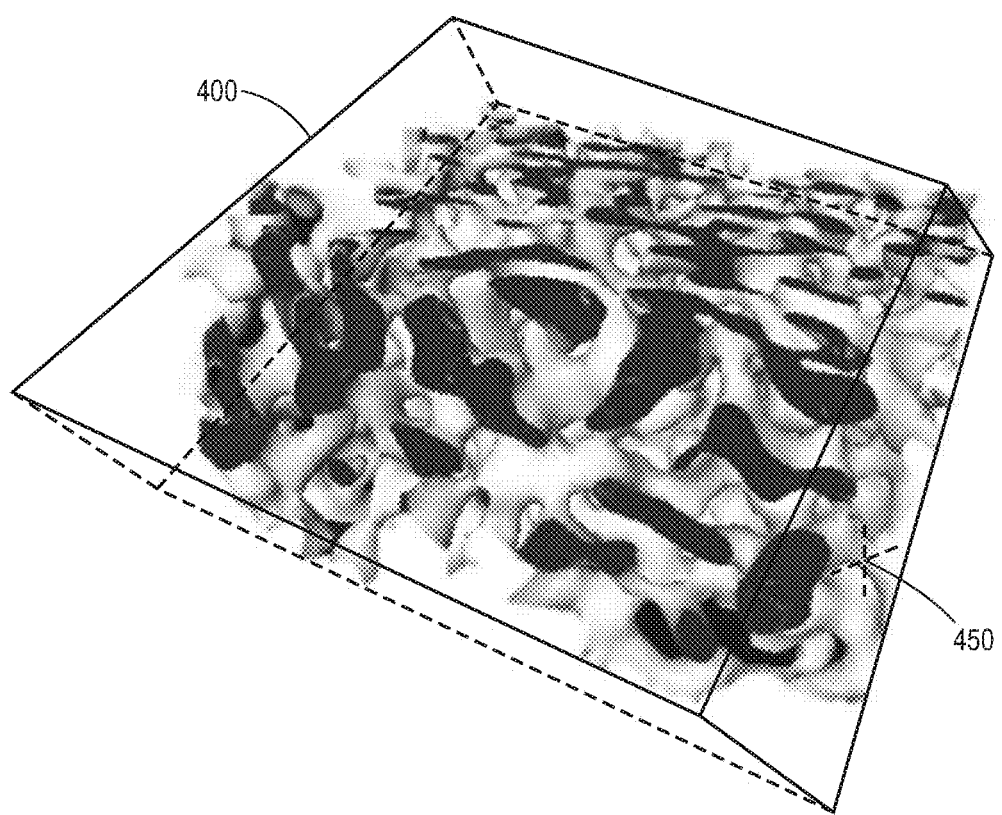
FIG. 18 illustrates an annotated example of a device having a random bicontinuous structure with mutually interpenetrating labyrinths.

FIG. 18 illustrates an annotated example of a device having a hyperbolic bicontinuous structure forming mutually interpenetrating labyrinths. As illustrated in FIG. 18, the device forms a virtual volume 400 with bounding surface 450. In this example, the device forms a cubic or rectangular volume; however, various other polygonal, irregular, or other volumes could be realized, with their corresponding bounding surfaces.

In FIG. 18, the device includes one surface comprised of hyperbolic patches which make up the bicontinuous structure.

It is noted that the opening and exit of the tunnels to the outside bounding surface of the structure can be flared out, or otherwise distorted or arranged to enable more or less funneling of light in or out. These flare structures can be seamlessly fused to the tunnel system.

It is further noted that the hyperbolic bicontinuous structures described above may be utilized in various other applications.

For example, the saddle-shaped hyperbolic patches comprising the bicontinuous structures may be used as substrates for creating curved electronic devices such as, but not limited to gates, transistors, up to chips and systems on chips A three-dimensional electronic chip or system can allow for better circuitry integration and essentially saves space by containing a vertical component relative to a flat substrate, while remaining a continuous surface on which traces and nodes may be made into one or more surface-bound circuits The hyperbolic surface patches comprising the bicontinuous structures described above allow an extrinsic third dimension without losing the existing two-dimensionality of conventional chips or systems. This maintains an intrinsic physical dimensionality of two while extrinsically occupying three dimensions.

For example, gates, transistors, memristors, photonic or spintroinc devices, neurons and other biological cells, flat or curved mirrors, LED's, light detectors, antennae, integrated circuits, processors and other circuitry components can be placed on or in the disclosed hyperbolic surface at surface nodes, which are connected by traces, wires or waveguides embedded on or in the surface to other parts of the surface, or connected by light beams or other EM signals jumping from one part of the surface to another, to create a three-dimensional hyperbolic chip or system.

In the described and illustrated hyperbolic bicontinuous structures, on the surfaces, any point on the surface can be reached by any other point on the surface without leaving the said surface. This allows the circuit to have an extrinsic three-dimensional structure, while only requiring an intrinsically two-dimensional wiring architecture.

It is noted that two-dimensional wiring indicates that the wiring does not leave the surface of the hyperbolic bicontinuous structure. In conventional three dimensional circuit structures, the wiring must travel through the substrate structure to connect to circuits at a different level.

Examples of a circuit having an extrinsically three-dimensional structure, while only requiring an intrinsically two-dimensional wiring architecture, are Illustrated in FIGS. 19-24. If desired, wires or traces (or other information carrying pathways) could be made to leave the surface of the bicontinuous structure converting the intrinsically two-dimensional wiring architecture into an intrinsically three-dimensional architecture.

Figure 19:
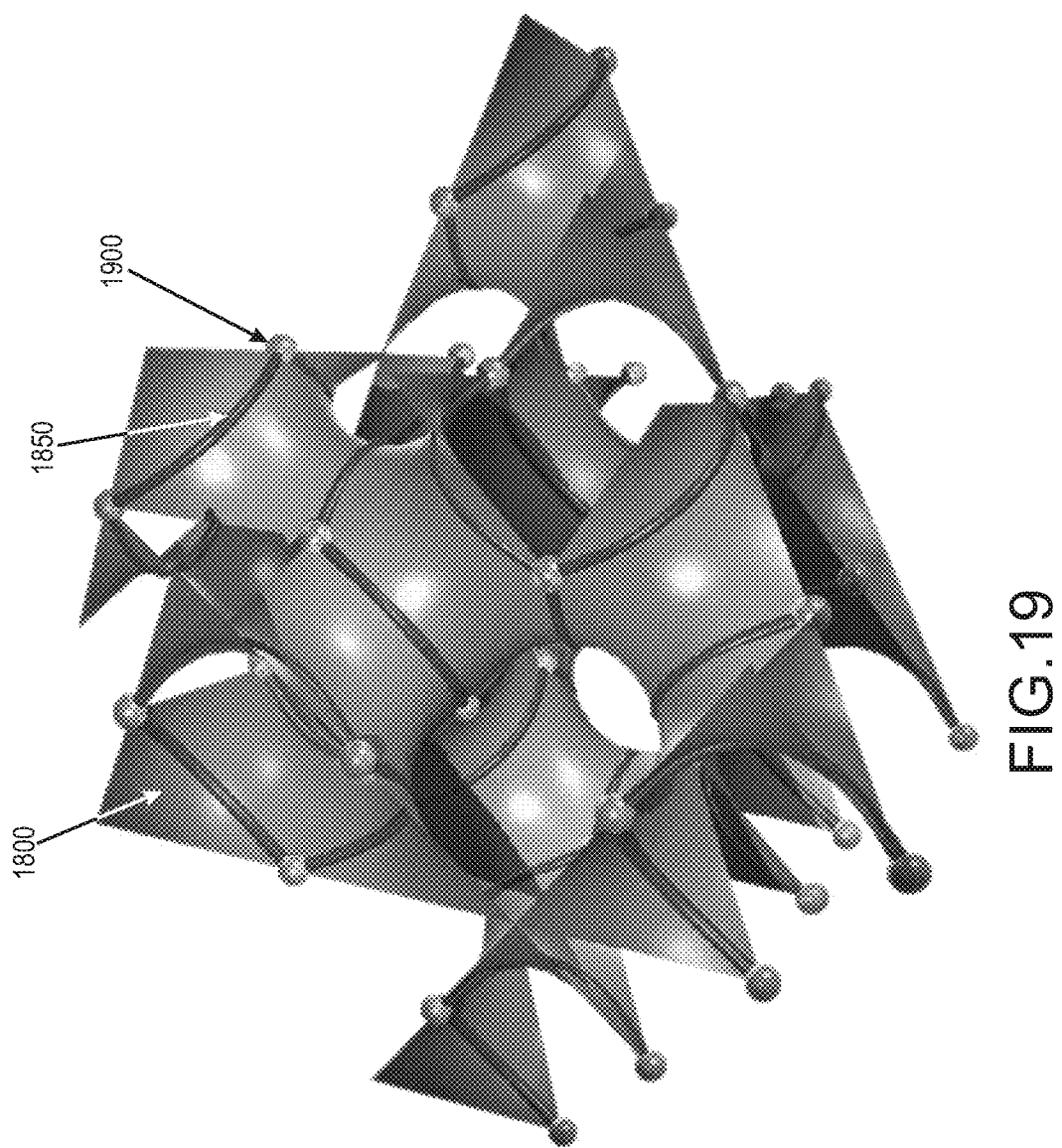
FIGS. 19-21 illustrate networks comprised of nodes and traces (vertices and edges) having a fully three-dimensional structure, with a two-dimensional wiring architecture that is fully embedded within or on the surface.
Figure 20:
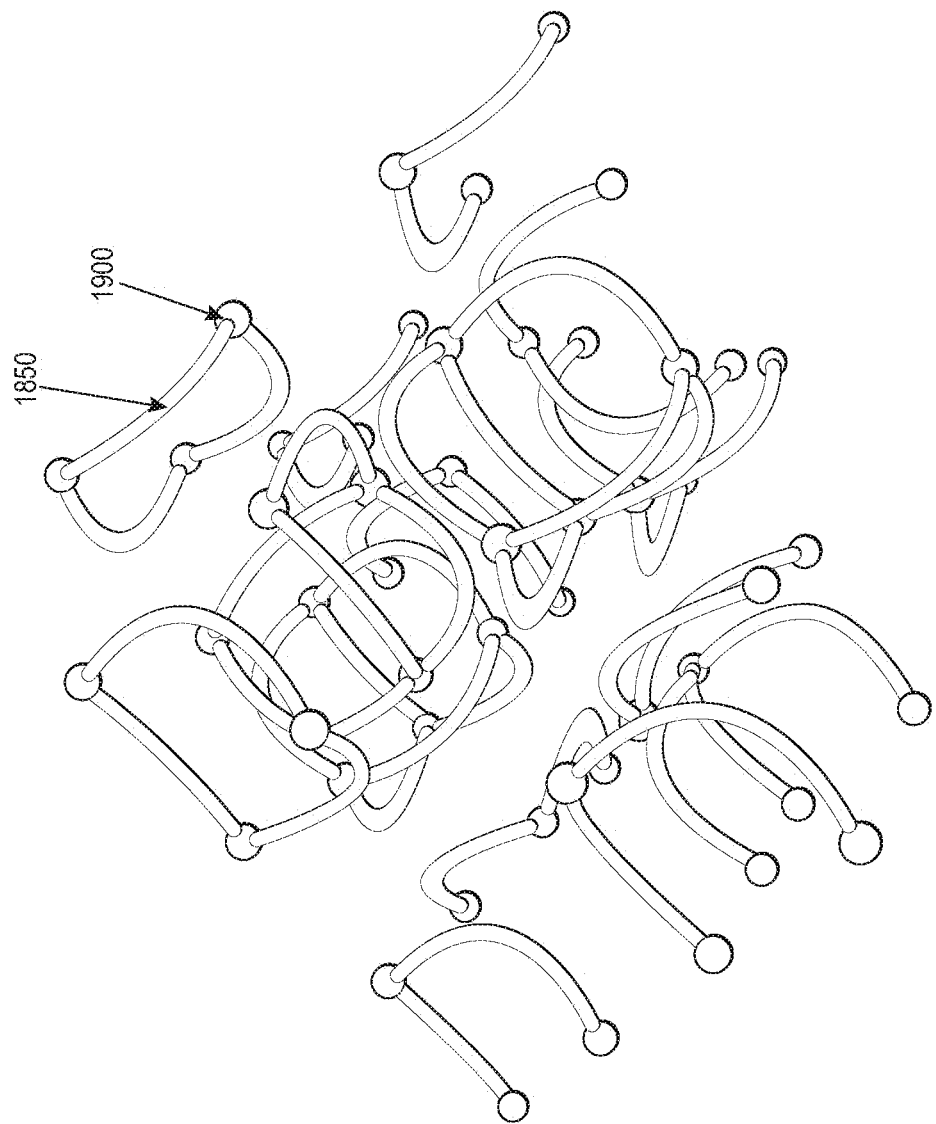
Figure 21:
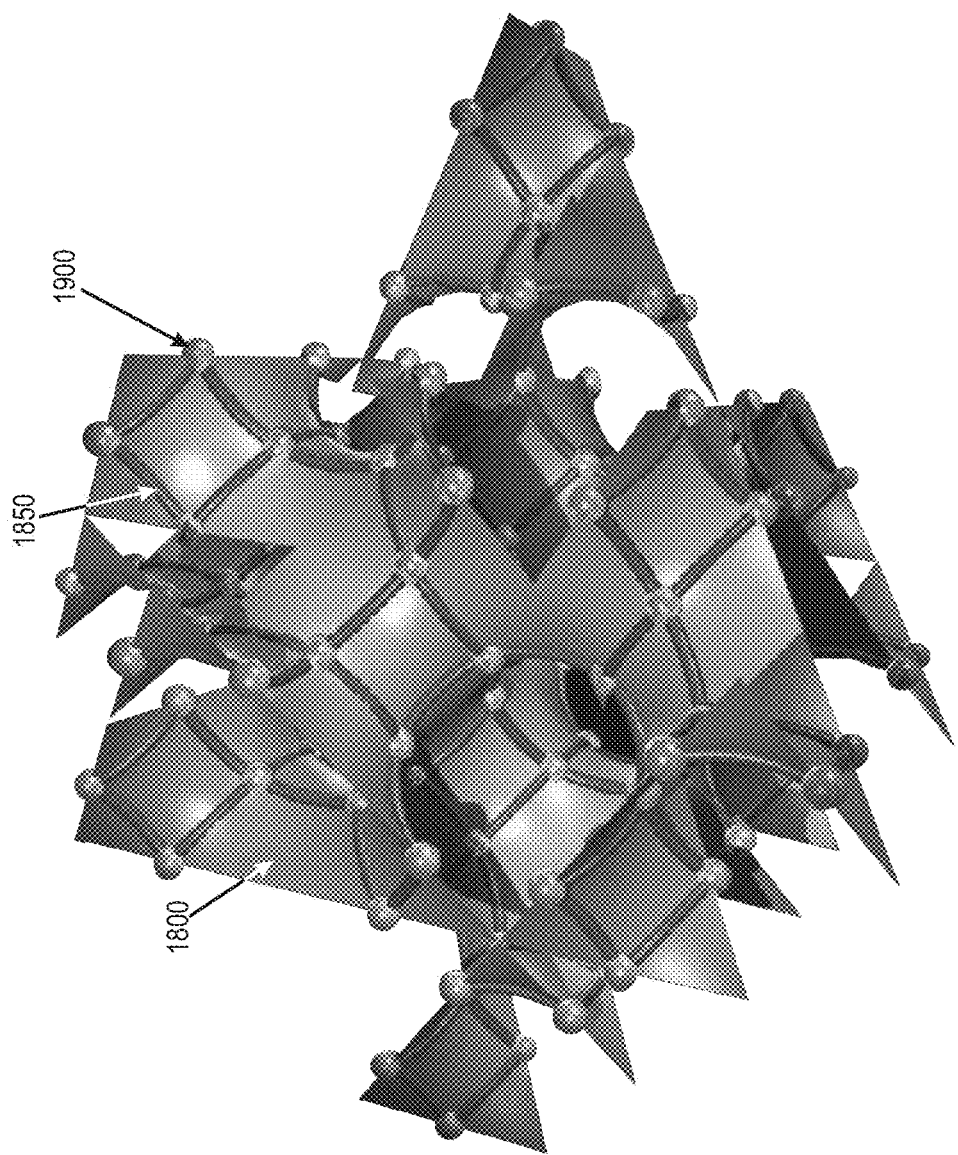
Figure 22:
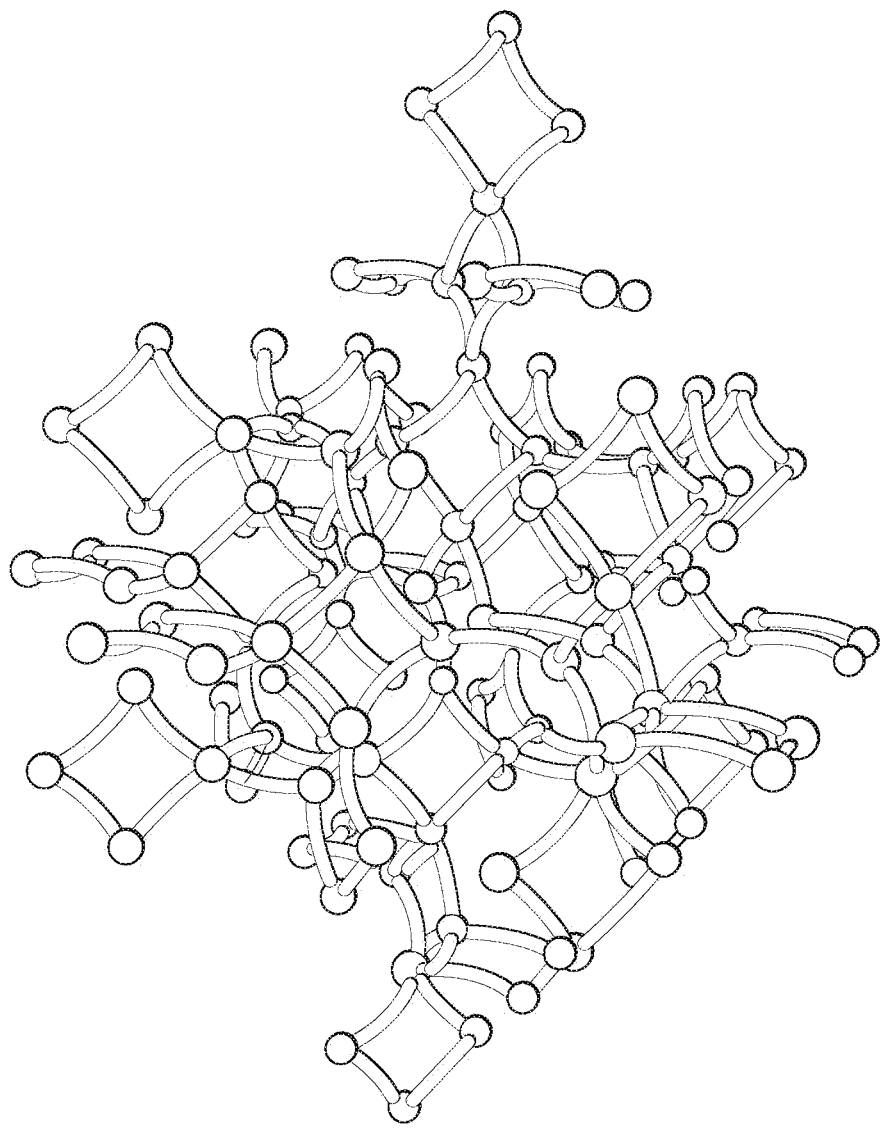
FIG. 22 illustrates the three-dimensional nature of the network.

In FIGS. 19 and 21, the Figures show the wiring and circuit nodes with respect to their respective hyperbolic surface structures. In FIGS. 20 and 22, the Figures show the wiring and circuit nodes with the underlying hyperbolic surface structure removed. The surface is removed in these figures for clarity to show the embedded network, but could also be designed to be removed in applications if so desired, for example if the surface was selectively dissolved by a substance that does not dissolve the circuit elements.

As illustrated in FIG. 19, a hyperbolic bicontinuous structure comprising hyperbolic surface patches 1800 has formed thereon wiring or traces 1850 and circuit nodes 1900. The wiring or traces 1850 are intrinsically two-dimensional in that the wiring or traces 1850 lie in or on the hyperbolic surface 1800, but the wiring or traces 1850 can effectively travel three-dimensionally between circuit nodes 1900. This is realized by the extrinsic three dimensionality of the hyperbolic bicontinuous surface 1800.

FIG. 21 illustrates another example, wherein a hyperbolic bicontinuous structure, comprising hyperbolic surfaces patches 1800, has formed thereon wiring or traces 1850 and circuit nodes 1900. The wiring or traces 1850 are two-dimensional in that the wiring or traces 1850 lie in or on the hyperbolic surface 1800, but the wiring or traces 1850 can effectively travel three-dimensionally between circuit nodes 1900. This is realized by the extrinsic three dimensionality of the hyperbolic bicontinuous surface 1800.

FIG. 20 illustrates the circuit architecture with the hyperbolic bicontinuous surface removed. As illustrated in FIG. 20, although the wiring or traces 1850 are two-dimensional with respect to the surface (intrinsic), the wiring or traces 1850 can effectively be three-dimensional between circuit nodes 1900.

FIG. 22 illustrates another example, wherein the circuit architecture is shown without the hyperbolic bicontinuous surface. As illustrated in FIG. 22, although the wiring or traces 1850 are two-dimensional with respect to the surface, the wiring or traces 1850 can effectively be three-dimensional between circuit nodes 1900.

Figure 23:
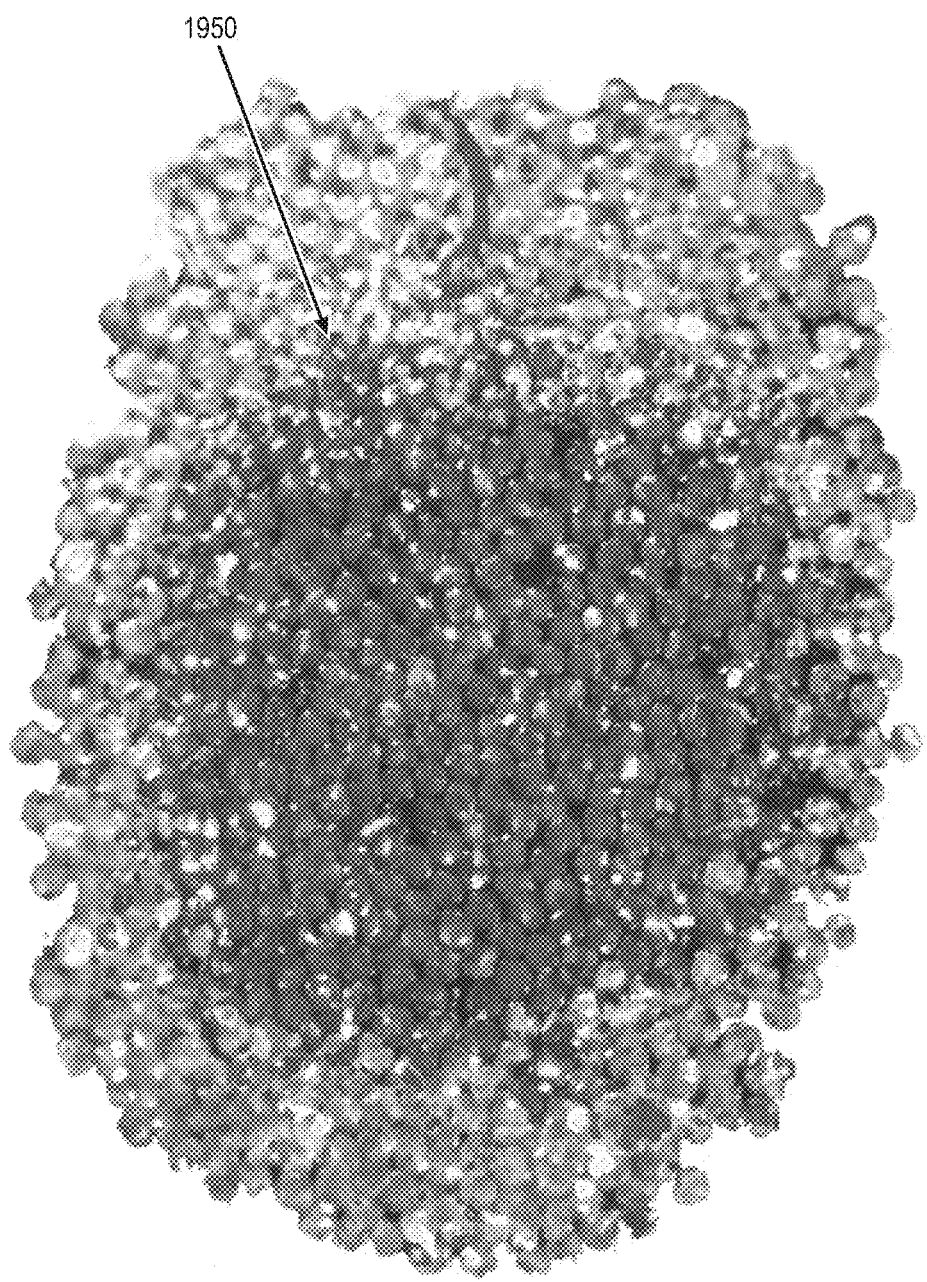
FIG. 23 shows an example of multiple photonic crystals each comprised of hyperbolic, triply periodic bicontinuous structures.

FIG. 23 shows discrete photonic "dots" 1950 that could be embedded on or in the hyperbolic surfaces.

Figure 24:
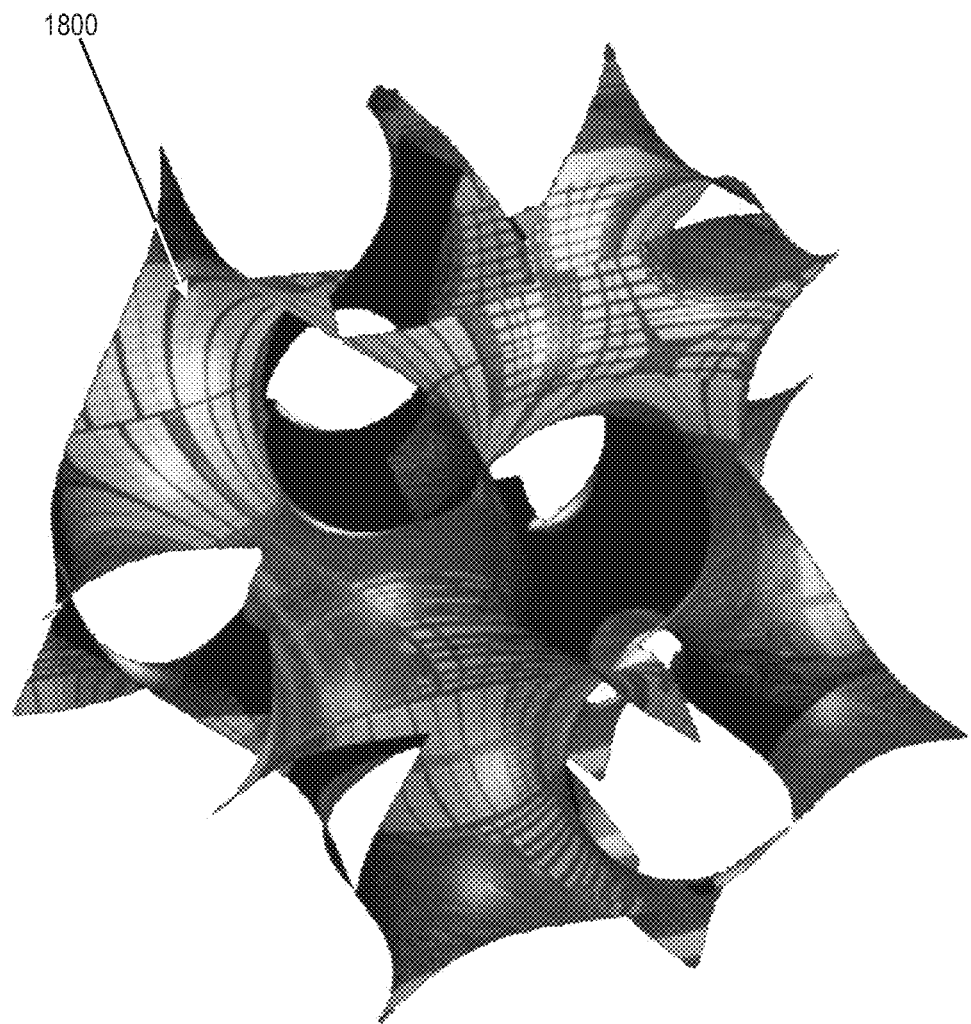
FIG. 24 illustrates an example of a bicontinuous, triply periodic minimal surface structure on which a two-dimensional pattern for a circuit and electronic devices has been embedded.

FIG. 24 illustrates an example of a hyperbolic bicontinuous structure with an embedded projection of an intrinsically two-dimensional electronic device 1800.

Figure 25:
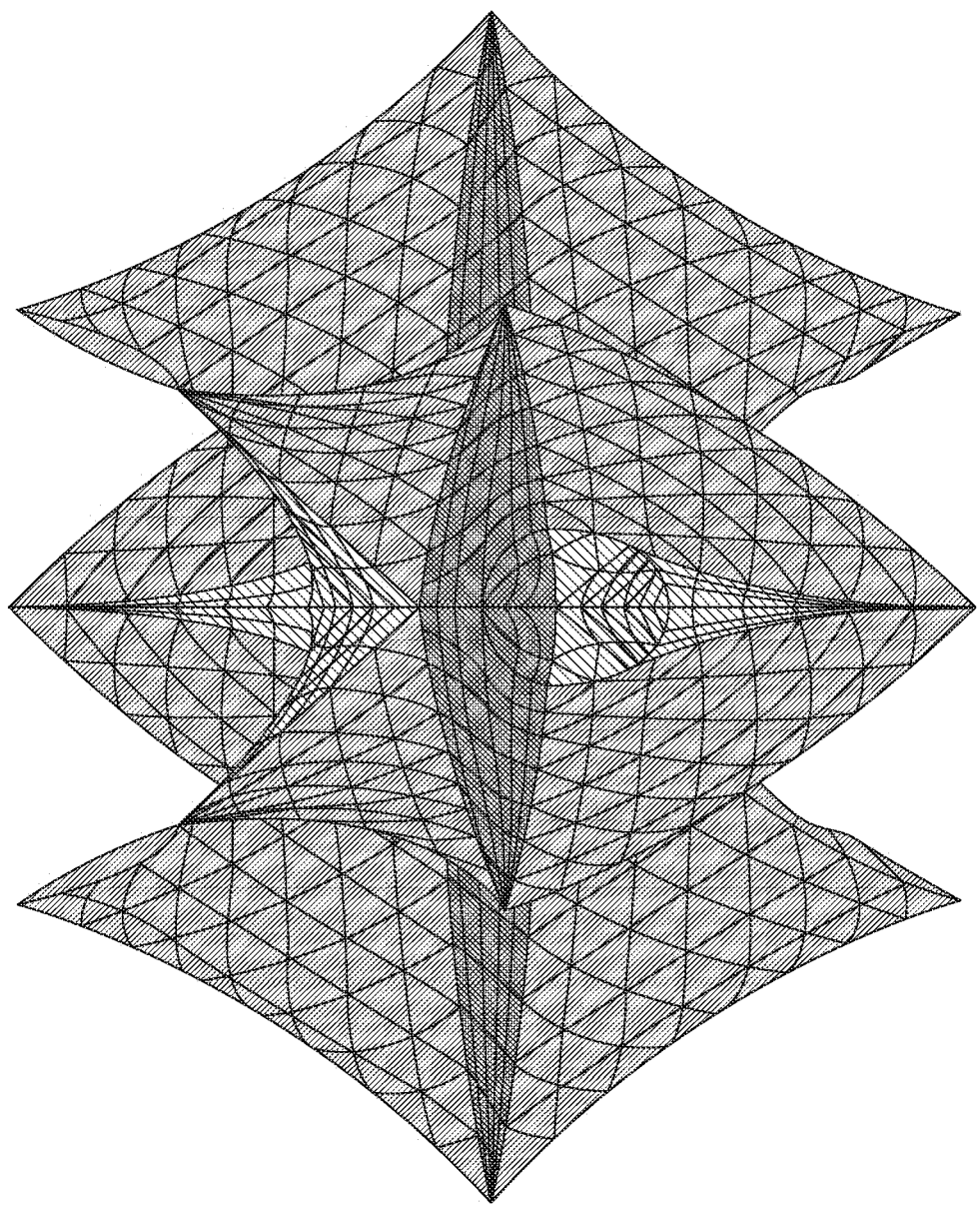
FIG. 25 illustrates an example of one-eighth of a unit cell of the "Batwing' minimal surface structure.

FIG. 25 illustrates an example of one eight of a unit cell of the "Batwing' minimal surface structure.

Figure 26:
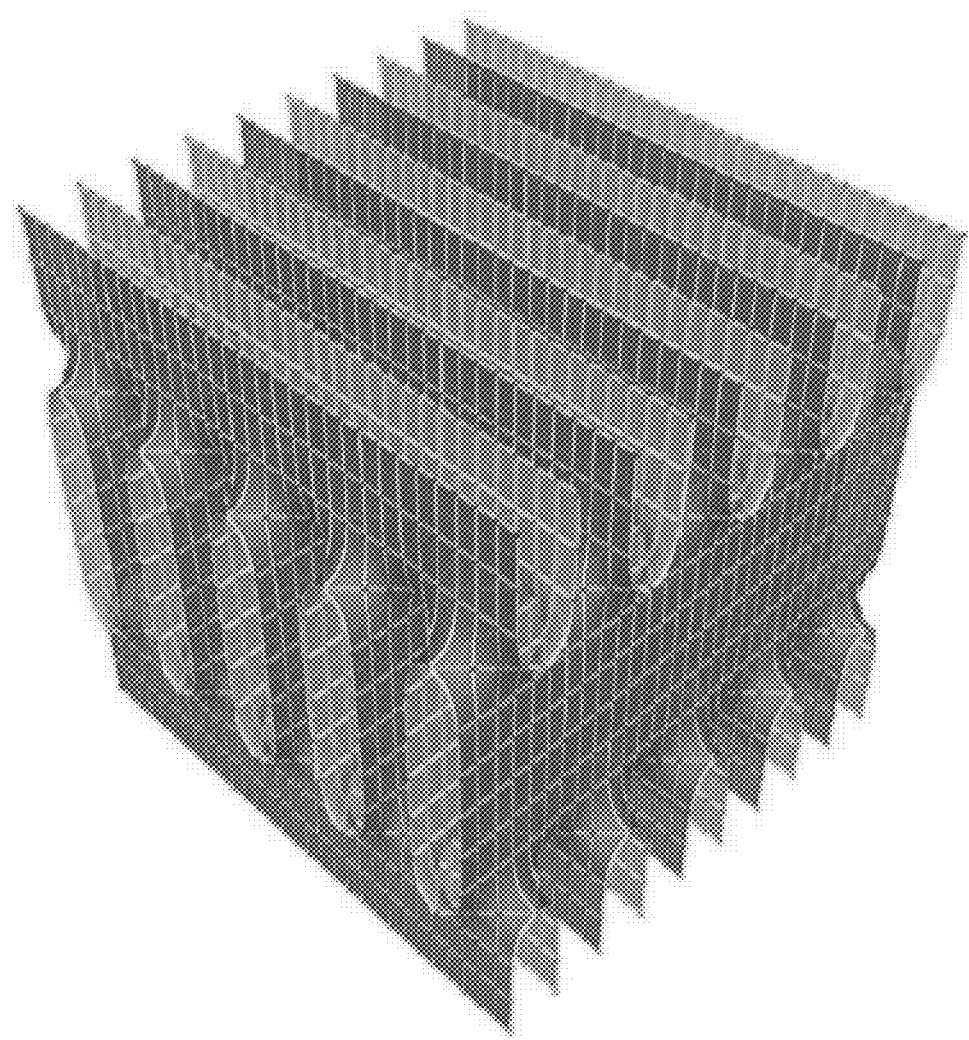
FIG. 26 illustrates an example of a CLP minimal surface structure.

FIG. 26 illustrates an example of a CLP minimal surface structure.

Figure 27:
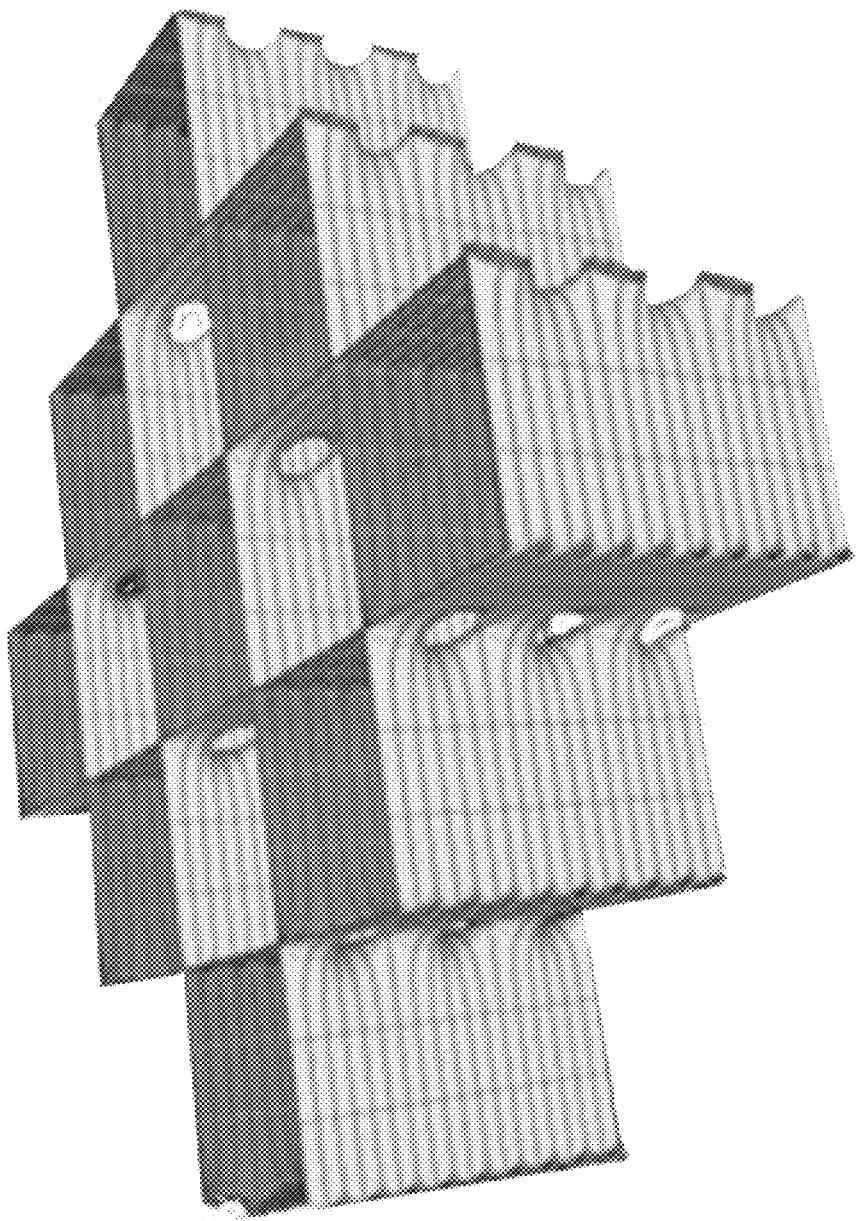
FIG. 27 illustrates another example of a CLP minimal surface structure.

FIG. 27 illustrates another example of a CLP minimal surface structure.

Figure 28:
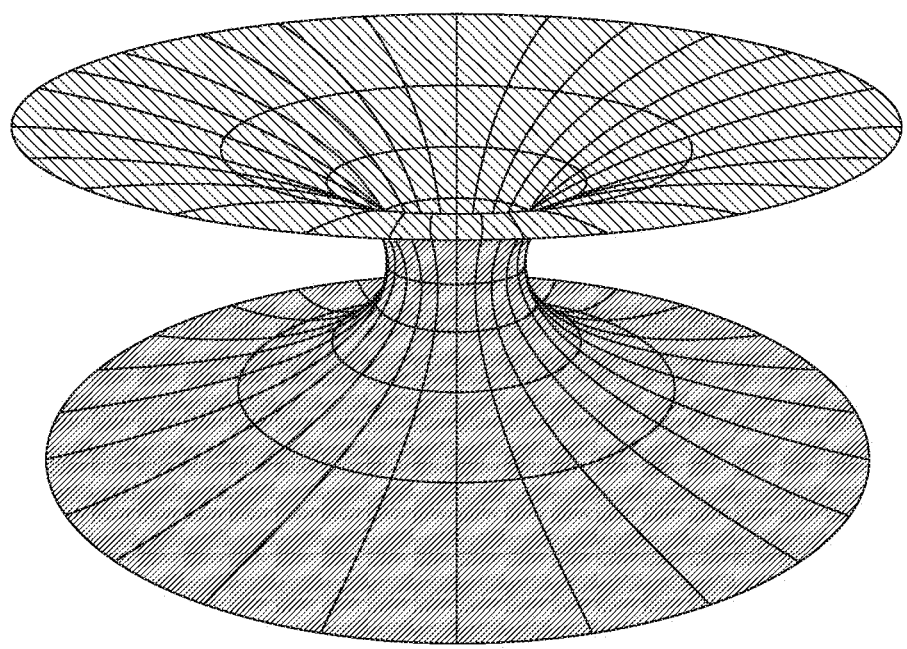
FIG. 28 illustrates an example of a catenoid minimal surface structure.
Figure 29:
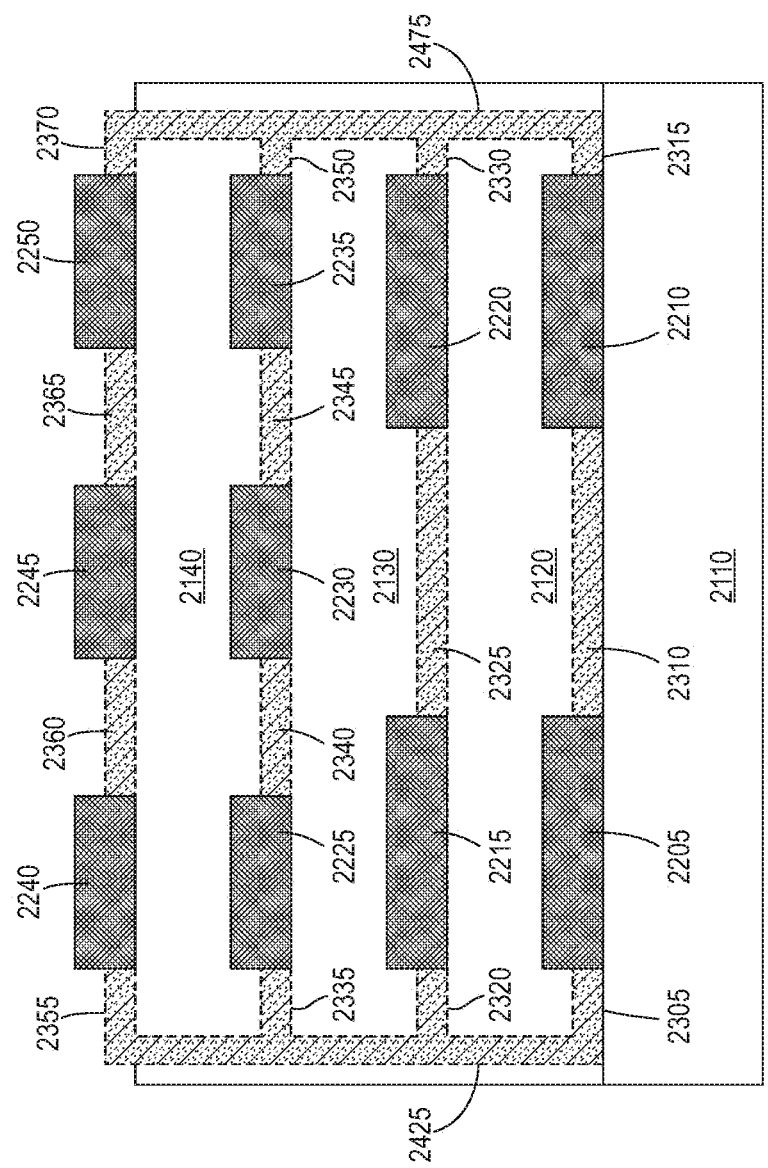
FIG. 29 illustrates a conventional three-dimensional circuit.

FIG. 28 illustrates an example of a catenoid minimal surface structure. Catenoids can be used to join two otherwise flat parallel surfaces so that the wiring on one flat surface can be continuous with the wiring on the second flat, parallel surface.

Figure 30:
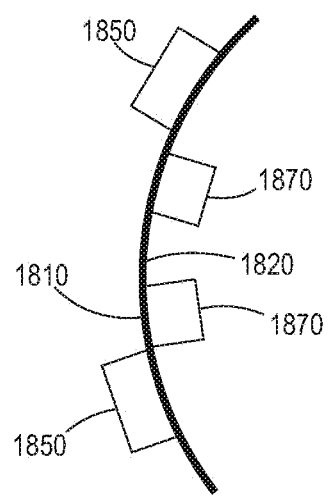
FIG. 30 illustrates an example of locating circuitry on a hyperbolic bicontinuous structure.

FIG. 30 illustrates an example of locating circuitry on a hyperbolic bicontinuous structure. As illustrated in the example of FIG. 30, a hyperbolic bicontinuous structure has two sides 1810 and 1820 of the same structure.

On one side of the hyperbolic surface 1810, circuits 1850 are formed, and on the other side of the hyperbolic surface 1820, circuits 1870 are formed. For most instances, circuits 1850 are electrically isolated from circuits 1870. However, the circuits could be connected by signals that go through the hyperbolic surface, e.g., via punctures in the surface and/or by signals that are propagated through the surface via wires or EM radiation or other means.

Figure 31:
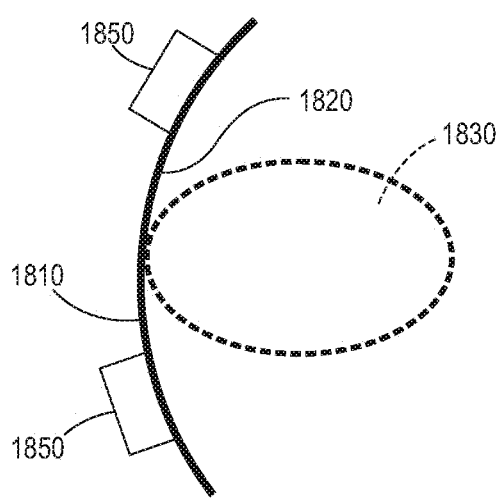
FIG. 31 illustrates an example of locating circuitry on one side of a hyperbolic bicontinuous structure and having a coolant flow along the other side of the hyperbolic bicontinuous structure.

FIG. 31 illustrates an example of locating circuitry 1850 on one side of a hyperbolic bicontinuous structure 1810 and having a coolant 1830 flow along the other side of the hyperbolic bicontinuous structure 1820.

As illustrated in the example of FIG. 31, a hyperbolic bicontinuous structure has two sides 1810 and 1820. These surfaces are two sides of the same structure.

On one side of the hyperbolic surface 1810, circuits 1850 are formed; however, on the other side of the hyperbolic surface 1820, no circuits are formed. For this instance, the volume (channel or tunnel system or labyrinth) bounded by one side of the hyperbolic surface 1820 is used for cooling purposes. For example, a coolant fluid could pass through the volume, effectively cooling circuits 1850 formed on hyperbolic surface 1810.

It is noted that the coolant side of the hyperbolic surface 1820 may also include various circuitry and devices as on the other side.

Two-dimensional hyperbolic surfaces can enable higher information and switching density than is possible on a two-dimensional flat chip because the surface area spanned at constant radius from a point is larger on the hyperbolic surface than on a flat surface.

Furthermore, circuits built on the bicontinuous surfaces comprising hyperbolic surface patches may be massively parallel, since the number of certain non-connected branching circuits that can be built on, for example, the hyperbolic plane is theoretically infinite. With respect to flat chips, the number of possible parallel, branched, and otherwise unconnected circuits is zero due to overlaps. This distinction between parallel circuits on hyperbolic versus flat Euclidean surfaces arises out of the falseness of the parallel postulate applied to hyperbolic surfaces as well known to those skilled in the art of non-Euclidean geometry.

It is further noted that the range of possible physical topologies for conventional flat-substrate-bound circuits is less than the possible range for circuits on bicontinuous hyperbolic surfaces.

On the other hand, the hyperbolic bicontinuous structures described above can be utilized to physically place the circuit nodes (logic gates, etc.) on a hyperbolic surface rather than on a flat surface.

The hyperbolic bicontinuous structures physically differ from current substrate-based chip designs in allowing extrinsic 3D connectivity yet being constructed on a single surface.

In summary, extrinsically three-dimensional devices can be constructed on intrinsically two dimensional structures when those structures comprise hyperbolic surface patches that are intrinsically two dimensional.

FIG. 23 shows an example of discrete photonic dots that could be embedded on or in a minimal surface device that could be locally flat or hyperbolic. In this example, the photonic dots comprise photonic crystals joined in different orientations, and form faceted faces like in the cuts of precious gems. The use of faceted photonic dots in a photonic circuit is enabled by manipulating crystal face junctions to achieve certain effects necessary for optical switching. The alternative to discrete dots is photonic dots made from cavities in a surface bound photonic crystal or crystals.

A photonic dot is defined as a photonic crystal that is reduced in size to the point where surface modes of the crystal interact with the light to give non-linear effects. The use of a photonic dot in optical switches enables the design of bistable and tristable optical circuits. The non-linearity of the light interacting with the photonic dots allows an all-optical switch because light can change the effective refractive index when incident on an array of photonic dots.

It is noted that a second light path could then be influenced by the first due to a switch in the photonic surface resonance. Dyes and other surface molecules or other matter could help in the control of the non-linear optical circuitry. Based upon this design, AND, NAND, OR, and NOR gates can be constructed using photonic dots.

In other words, utilization of the photonic dot circuits on the described hyperbolic surfaces a photonic dot circuit based optical computer can be constructed.

Furthermore, since the hyperbolic bicontinuous structures described above have near constant curvature, homogeneous distribution networks can be easily constructed in contrast to the conventional three-dimensional Cartesian grids.

The hyperbolic bicontinuous structures described above also provide a physical geometry for neural net architecture, thereby enabling interfacing live cultured neurons on the hyperbolic surfaces.

Predictability and tunability are intrinsic in the photonic dots on the hyperbolic bicontinuous structures because of the symmetries in these photonic devices. Thus, photonic dots can be combined with dielectric mirrors, aspherical dielectric Fresnel lenses and other optical components enabling various optical circuits.

These mirrors can be a priori designed to lie on fully predictable networked or fully parallel network topologies. Any one surface of the hyperbolic bicontinuous structure may have a very large number of fully interpenetrating, yet separate graphs or tree networks, producing highly symmetric optical network configurations in various classes of tilings and networks known to those skilled in the art of hyperbolic tilings and networks.

The tilings can be seen as the choices of hardware building tiles and the networks as the circuit elements drawn on the tiles. The nodes are sites where photonic devices can sit and direct the flow of optical information by changing state using other optical circuitry.

In these optical circuits, the number of network topology choices is high because of the vast number of possible networks between nodes on the surfaces. Switching just a few dozen nodes in the possible networks on these surfaces gives high-density information entropy for fully utilizing the speed of optical circuits.

An example of a simple photonic switch is to use fast photochromics and modulated pulsed lasers. In this example, the header pulse may be long or short (to turn the transmission ON or OFF) and then the subsequent higher frequency pulses are allowed to pass the photochromic film or not. This circuit allows fast optical reactions, color change, beam interference, and optical computing.

It is further noted that the hyperbolic bicontinuous structures may be utilized in optical environments, electrical environments and/or electro-optical environments.

The hyperbolic bicontinuous structures provide a two-dimensional design with the properties to host three-dimensional circuits and networks comprised of nodes and traces. Within their boundary these surfaces can have close to constant curvature without sharp edges, can have a relatively large surface area per unit footprint, and/or can enable a large intrinsic information density flow rate compared to 2D circuits confined to flat Euclidean planes.

It is also noted that, as an alternative, the hyperbolic bicontinuous structures may be filled on one side of the surface to form a porous solid support for circuitry etc.

It is also noted that bicontinuous surfaces can host circuits of various materials such as topological insulators.

The hyperbolic bicontinuous surfaces may act as substrates for circuits comprising memristor arrays, thereby enabling a superior performance in solving the von Neumann bottleneck, a problem known to those skilled in the art of computer architecture, relative to memristor arrays on Euclidean planar surfaces.

Memristors are resistors that remember the amount of current that has passed therethrough. Memristors can be used as switches and are passive devices so memristors do not lose their memory when turned off.

Memristors can be constructed on bicontinuous surfaces using self-assembly and/or three-dimensional lithography. For example, memristors can be implementable on a 3D printed gyroid (bicontinuous surface) using self-assembly of DNA, for example, as a template for nanowires.

The memristor works by changing the position of oxygen vacancies in an array of titania cross-bar latches, which forms a transistor that remembers its former logical state.

By constructing a memristor on a bicontinuous surface, the memristor realizes a greater efficiency of construction on a flat surface and can take advantage of the optimal use of the three-dimensional interconnectivity circuits built on bicontinuous surfaces provide.

It is noted that light sensitive analogs of memristors may be imprinted or in some way formed or bound on the surface of a mirror-coated bicontinuous surface or on an optical, electrical or optoelectronic or other circuit embedded on or in a bicontinuous surface. This is also applicable to meminductors and memcapacitors and to other components, devices, or even cells such as light interrogable or light sensitive or light emitting cells such as, but not restricted to modified neurons.

It is further noted that the above description has been directed to bicontinuous surfaces. The various descriptions are also applicable to multicontinuous surfaces.

It is further noted that the above description has been directed to bicontinuous surfaces or arbitrary topology or geometry or periodicity. The various descriptions are also applicable, though not restricted to any combination of low and high genus hyperbolic surfaces with or without internal symmetry or symmetries with or without translational periodicity in one two or three dimensions.

It is further noted that the bicontinuous surface structures can support coolant flow on one side of the bicontinuous surface.

In other words, one side of the bicontinuous surface supports the physical circuits, while the other side of the bicontinuous surface provides the channel for allowing the flow of coolant, thereby effectively cooling the circuitry in an isolated manner.

It is noted that the bicontinuous surface structures can be utilized to channel light so as to form a photonic circuit or circuits.

Thus, it is noted that the bicontinuous surface structures can include grooves or waveguides of nonlinear optical or magneto-optical material or magnetic field generating circuitry to channel light along the surfaces.

In another application of the bicontinuous surface structure, octagonal chips can be implemented on the bicontinuous surfaces.

More specifically, the octagonal chips could be bent into the saddles of the bicontinuous surface structure, have their pins and complementary holes on their sides and then connect the chips by a click method to build up the bicontinuous structures.

It is noted that there are a number of geometric variations, for example 3-sided, 4-sided, 6-sided, and 7-sided chips.

The distinction between a hyperbolic 8-sided chip and a flat 8-sided chip is explained by dividing the flat "stop sign," an 8-sided shape, into 8 triangles that meet in the center. Each central angle is 45°.

Since there are 8 triangles, this adds up to 360°, which is what is expected if a circle is drawn with its center at the center of the chip. In hyperbolic 8-sided chips, the angle is always greater than 360°, because there is more room. This provides the extra surface area compared with flat chips.

Anticlastic surface is another name for a hyperbolic surface. However it is defined as hyperbolic everywhere but the edges. The bicontinuous surfaces are made by continuously assembling anticlastic or hyperbolic patches to form tunnels. They also differ by having flat points of zero curvature.

Anticlastic surfaces are used commercially for the tension roofs at airports, sports stadiums (parks), and entertainment venues and as architectural focus pieces.

Using anticlastic architectural surfaces, electronic circuits can be built on the hyperbolic patches and then the small portions can be assembled into larger pieces.

It is noted that bicontinuous refers to the local condition where the surface separates two labyrinthine sets of tunnels. However, it is not valid at the edges of the structure, since the surface terminates and can therefore not separate anything.

It is further noted that for three-dimensional chips, it is not necessary to have a completely hyperbolic surface, as it may, in some cases, be sufficient to have a set of two-dimensional stacked chips joined by a surface that is locally hyperbolic. However, it is noted that a bicontinuous surface maximizes speed except for the local flat points, not just flat surfaces joined by tunnels.

It is noted that a flexible anticlastic fabric may be made of a flexible solar films with embedded circuitry for architectural purposes, and a solar concentrator may be made from a reflective bicontinuous surface that funnels and concentrates light downwards into the structure for further use.

It is well known to those skilled in the art that bicontinuous, triply periodic minimal surfaces such as the gyroid or Batwing surfaces are comprised of smaller patches related by crystallographic symmetry operations. Each of these patches is a small saddle-shaped unit with negative Gaussian curvature. The curvature is defined for each point on the surface as follows.

A point on a surface, in two dimensions, has two orthogonal principal curvatures that define its surface curvature. The principal curvatures are $k_1$ and $k_2$, each of the principal curvatures is the inverse of the corresponding radius of curvature at that point. The mean (H) and the Gaussian (K) curvatures are defined as $(k_1+k_2)/2$ and $k_1 \cdot k_2$, respectively.

Constant mean curvature surfaces include the sphere, the Euclidean plane, and the hyperbolic plane. Here three distinct classes of Gaussian curvature are defined for points on surfaces, as is well known to those skilled in the art of differential geometry.

The first class is defined for points where the Gaussian curvature is positive, i.e., when the principal curvatures at a point are in the same direction (i.e., the principal curvatures multiply to give positive products, and thus K>0). These types of curvatures are typical of points on the surface of closed spheres and other closed ellipsoids and similar surfaces.

The second class is defined for points where the Gaussian curvature is zero, i.e., when the principal curvatures multiply to give zero i.e., when either $k_1$ or $k_2$ or both=0, and thus K=0. These types of curvatures are typical of points on the surface of flat planes, cylinders (tubes) and cones.

The third class is defined for points where the Gaussian curvature is negative, i.e., when the principal curvatures at a point are in opposite directions, (i.e., the principal curvatures multiply to give negative products, and thus K<0). These types of curvatures are typical of points on the surface of saddles or hyperbolic surfaces.

When K<0 and H=0, everywhere or nearly everywhere on a surface, the principal curvatures are everywhere equal and opposite and the surface is a minimal surface. These surfaces are typical of soap films suspended in a wire frame and are well known to those skilled in the art. Such soap films suspended on a boundary wire frame do so with the minimum surface area, hence the name minimal surface.

Parallel surfaces are defined as parallel to minimal surfaces as is customary to those skilled in the art. Parallel surfaces are formed by translating each point normal to the minimal surface by distance t. These surfaces have a larger surface area than their corresponding minimal surface.

It should also be noted that any other surface sharing the same boundary, but not sharing the same geometric coordinates as the minimal surface will also have a greater surface area than the minimal surface spanning the same boundary.

By the definition of a minimal surface, any saddle shaped minimal surface patch containing an embedded network comprised of nodes (devices) and wires/waveguides will have a smaller surface area than any of its corresponding parallel surfaces or any other surface that spans the same boundary.

If the embedded nodes and wires/waveguides terminate at the boundary of the surface patch (so as to provide continuous hookups when the surfaces are joined), the wire length on the surface patch will also be minimized on the minimal surface relative to the same network embedded on or in its corresponding parallel surfaces or any other surface that spans the same boundary.

Since the integrated wire lengths used in a device are an important factor in governing the speed of the device, then minimizing these wire lengths is a distinct advantage. Under the condition that these surface patches can be formed into a bicontinuous triply periodic minimal surface by crystallographic symmetry operations, the bicontinuous minimal surface represents a surprisingly efficient structure for performing very fast 3D computing when the device is fully substrate bound.

On a sphere, a geodesic looks like the curved longitude "lines" or flight paths often taken by intercontinental airlines. On a hyperbolic surface patch, geodesics are also shortest paths between two points along the surface and also appear curved in many situations, though sometimes these can be straight lines (in the Euclidean sense).

The above described hyperbolic bicontinuous structures provide a high degree of predictability about a myriad of different high symmetry circuits that form short path circuit templates that connect in three-dimensional space, but are addressable by only two surface coordinates (i.e. u, v) rather than the normal Euclidean space (x, y and z).

It is also noted that different modes of the circuitry can be used for computing.

For example, a circuit can be constructed by connecting sets of nodes by wires or waveguides embedded on or in the hyperbolic bicontinuous surface in a manner useful for various operations including but not limited to storage and retrieval, computation, switching and distribution.

Components or sub circuitry can be located at nodes so that a partial or complete circuit or device can be made on or in a single minimal surface patch of limited areal extent. Complete circuits or devices can also comprise multiple surface patches decorated with similar or distinct circuits or devices and joined together at the boundaries of the patches. Such devices can have node separations that take advantage of the scale of the curvature.

With internode distances much smaller than the curvature of the hyperbolic bicontinuous surface, the embedded circuitry and/or devices can locally very closely resemble conventional, flat (Euclidean) circuits or devices that can be manufactured by conventional means. These relatively flat sub-circuits patches, however, can be interconnected at a length scale that is of the same order of the curvature, and therefore, these circuits can be relatively curved and the circuit becomes extrinsically three-dimensional when extended along the surface by repeating the pattern, or partially repeating the pattern.

So the scale of circuitry or sub-circuitry to the scale of the curvature needs to be considered when designing the circuitry; however, curvature variations on the surface are not critical for small patches where the internode distance is relatively small.

It is desirable that the curvature variations should be minimized for maximum reduction in integrated wire length, and maximisation of speed in such a device, particularly when the length scales are similar. The most homogeneous surface, in the sense of homogeneity of curvature variation, is Schoen's gyroid (G) surface.

Thus, without being held to theory and for substrate bound circuits and devices that fill a volume on a single surface, those embedded in or on the gyroid minimal surface are likely the most for information for transfer density and speed, when the considerations of relative scale are taken into account.

Nonetheless, other minimal surfaces known to those skilled in the art maybe similarly efficient at minimizing wire length. Such surfaces include but are not limited to the bicontinuous P-surface, the D-surface, the Batwing surface and many others known to those skilled in the art.

Lastly, various antenna constructions can be organized to conform to various optimization needs. The hyperbolic bicontinuous surfaces may have various embedded circuits, labile or not, for a desired antenna or choice of antennae. These antenna(e) circuits may be responsive to applied signals.

More specifically, a signal may be transmitted to a bicontinuous surface containing various desired circuits and devices including labile circuits such that the signal induces, via logical gates and sub-circuitry, a physical change in the antennae configuration as a way of tuning the antennae for receiving a multiplicity of possible signals.

This could be manifest even within a solid state framework such as a cell phone case, or the walls of a truck or spacecraft, etc., configured for the type of frequency, signal, distance, etc., of the incoming signal.

The applied signal may also contain information to cause changes in the surface reflectivity and/or the shape formation or both of the material being used to control the antenna.

In constructing a three-dimensional circuit on a bicontinuous surface structure, graphene ribbons can be utilized.

Graphene ribbons can be cut from larger graphene sheets, or carbon nanotubes can be slit open lengthwise and unfurled or the graphene ribbons could be formed onto pre-existing templates. The graphene ribbons provide a band gap—an energy range that cannot be occupied by electrons and that determines the physical properties, such as the switching capability. The width (and edge shape) of the graphene ribbon determines the size of the band gap, thereby influencing the properties of components constructed from the ribbon.

As previously noted, an optical switch may include a plurality of bicontinuous sub-structures, each bicontinuous sub-structure having multiple potential optical entry points and each potential optical entry point having a corresponding primary photon exit point, for a given input trajectory.

It is defined here that a sub-structural element of a bicontinuous surface is a small or large fully connected part of a bicontinuous surface and is here called a bicontinuous sub-structure or surface patch.

It is noted that under this definition, the bicontinuous sub-structure or surface patch may or may not be bicontinuous.

It is also defined here that a sub-structure of a given bicontinuous surface can be the given bicontinuous surface itself. This is well known to those skilled in the art of set theory as the identity set.

It should also be noted that separate bicontinuous structures can be viewed as a union of smaller subsets of a single bicontinuous structure, such that curvature across joined sub-structures can be smooth and continuous and without forming holes that could otherwise join the two mutually interpenetrating tunnel labyrinths on either side of the bicontinuous surface.

In this case, the primary or secondary photons exiting one substructure can act as an input to another substructure. Secondary photons can include scattered rather than primary specularly reflected light.

In certain applications, it may useful to define any particular path of primary and secondary photons by a nomenclature comprising n symbols, where n=the number of bounces each photon takes transgressing the whole structure, and whether each successive bounce is along a primary or secondary path.

For example, a single bounce along the primary path (i.e. a singular specular reflection event) would be described as a "p" event. Two bounces (n=2) along the primary path would be "pp" or $p^2$ events.

If the first bounce sends the photon off the primary path, "s" can be used to describe or name this secondary event.

Thus, exiting photons can have both p and s event history; e.g., $p^3$; $p^2s$.

In some cases, the nomenclature may result in " . . . sp", where a secondary photon bounces specularly so that it travels as if it were a primary photon travelling along a geometrically transformed primary path.

Thus, a device may have, where the exit photons from a particular tunnel, a combination of pathways involving p and s events, and these may arise from paths that have followed separate tunnel branches.

In the case of relatively rough surfaces, the relative ratio of s:p events will increase relative to that of a perfectly smooth and reflective surface.

It is noted that optical absorption, total internal reflection, Brewster angle effects and other optical phenomena, not restricted to polarization, interfacial dielectric contrast, emission etc., may lead to a ratio of input photons to emerging photons greater or less than unity.

It is also noted that exiting photons that follow a path through the bicontinuous structure may have different optical or quantum property than when input, for example it may differ in frequency, polarization, state of entanglement etc. compared with its input Each bicontinuous sub-structure or surface patch may be coated with an electro-optic or magneto-optic coating or other coating having optical properties that change in response to certain light characteristics, for example its reflection properties.

Furthermore, an optical switch may include a plurality of interconnected tunnels each delimited by a surface patch, each surface patch having predetermined reflective properties, the tunnels forming mutually interpenetrating labyrinths, each tunnel having multiple potential optical entry points and each potential optical entry point having a corresponding primary optical exit point for a given input trajectory.

Each tunnel may be coated with an electro-optic coating having reflective properties that change in response to certain light characteristics. Each surface patch delimiting each tunnel may have points that are predominantly hyperbolic.

The plurality of tunnels may be arranged into mutually interpenetrating labyrinths, divided by a two-sided hyperbolically curved interface. One or both tunnel labyrinths on one or both sides of the surface may be filled with an optically transparent or partially transparent material. One tunnel labyrinth on one side of the surface maybe filled with a non-optically transparent material.

In addition, an optical switching system includes a laser light source; an optical switch for receiving a laser light beam from said laser light source, said optical switch including a plurality of bicontinuous sub-structures, each bicontinuous sub-structure having multiple potential optical entry points and each potential optical entry point having a corresponding primary optical exit point for a given input trajectory; and a light collection device for receiving photons sourced from the laser light beam after exiting said optical switch. The laser light source may include a light deflection system for physically changing a direction of the laser light beam such that the angle of incidence of the laser light beam upon the optical switch surface is changed, thereby changing the optical entry point and trajectory of the laser light beam.

Each bicontinuous structure or its substructure may be coated on one or both sides with an electro-optic coating having reflective properties that change in response to certain light characteristics. Each bicontinuous structure or its substructure may be comprised of hyperbolic surface patches. The bicontinuous structures contain a hyperbolically curved interface that defines mutually interpenetrating tunnel labyrinths. The laser light source may comprise multiple primary photon input paths relative to the bicontinuous structure. Each path may have a distinct optical entry point with respect to said optical switch and/or a distinct primary optical exit point with respect to said optical switch, for each of the given multiple input trajectories.

A three-dimensional optical switch includes a plurality of bicontinuous structures. The plurality of bicontinuous structures forms a virtual volume. Each bicontinuous structure has an opening or openings that are topologically connected to at least one of the tunnel systems.

The openings are located around a virtual bounding surface of the virtual volume. Each opening has multiple potential optical entry points. Each potential optical entry point has a corresponding primary optical exit point for a given input trajectory. Each bicontinuous structure may be coated with an electro-optic coating having reflective properties that change in response to certain light characteristics. Each bicontinuous structure may comprise hyperbolic surface patches. The bicontinuous structures may form mutually interpenetrating labyrinths and contain a hyperbolically curved interface. Each opening may include potential optical entry points and potential optical exit points.

Furthermore, the bicontinuous surface structures can be embedded with pigments to create various colors or designs. These bicontinuous surface structures can be further embedded into fabrics.

The bicontinuous surface circuit containing structures can be packaged for example by embedding into plastics, polymers or composites to provide antenna, sensors or computing power or other functionality for electronic devices.

Moreover, bicontinuous structures can comprise minimal surfaces where there are no tight bends along any path on or in the surface (or optical waveguides embedded therein) can speed up a signal from point to point, and processing segments can be clustered for optimization along the continuum. In such situations, the curving, flowing surfaces can rise up multiple stories (circuit levels or planes) high and never encounter a 90 degree turn.

For example, in the same vertical height as a ten-layer stack, minimal and bicontinuous surface structures can have three times more transistors and never encounter a 90 degree turn between them. This enables the realization of less heat, less power consumption, optimally shorter paths, and higher connectivity options. The minimal and bicontinuous surface architecture is scalable from connecting logic gates to circuit boards to networked devices.

A three-dimensional circuit includes a plurality of bicontinuous sub structures or surface patches; and a plurality of circuit elements. The plurality of circuit elements are formed, in a two-dimensional manner, on the plurality of bicontinuous sub-structures or surface patches. Bicontinuous structures can be comprised of a plurality of bicontinuous substructures or surface patches, where each substructure or surface patch can have various sub-circuits of a larger circuit formed from the joining, fusion, merging or overlapping of substructures or surface patches The bicontinuous sub-structural elements or surface patches may have points that have predominantly hyperbolic curvature.

The bicontinuous structures may form mutually interpenetrating tunnel labyrinths and contain a hyperbolically curved interface.

A three-dimensional circuit includes a plurality of tunnels each bound by a surface patch, the tunnels joined, forming mutually interpenetrating tunnel labyrinths; and a plurality of circuit elements. The plurality of circuit elements are formed, in a two-dimensional manner, on the plurality of surface patches delimiting their respective tunnels.

The tunnels may be delimited by surface patches that contain points having predominantly hyperbolic curvature.

The tunnels may form mutually interpenetrating labyrinths divided by a hyperbolically curved interface.

A three-dimensional circuit includes a plurality of bicontinuous sub-structures, the plurality of bicontinuous sub-structures forming a virtual volume, each bicontinuous sub-structure having one or more openings; and a plurality of circuit elements. The plurality of circuit elements are formed, in a two-dimensional manner, on the plurality of bicontinuous sub-structures.

The bicontinuous structure may contain a surface that is predominantly comprised of points where the surface is hyperbolically curved.

The bicontinuous structures may form mutually interpenetrating tunnel labyrinths and contain a hyperbolically curved interface.

A three-dimensional circuit includes a hyperbolic bicontinuous structure forming a substrate; a first set of nodes formed on one side of the hyperbolic bicontinuous surface; and a first set of electrically conductive traces formed between the first set of nodes. The first set of electrically conductive traces is formed two-dimensionally on the first surface of the hyperbolic bicontinuous structure. The first set of electrically conductive traces between the first set of nodes effectively form a three-dimensional circuit on one side of the surface.

A coolant may be in contact with the second side of a surface defining a hyperbolic bicontinuous structure to provide effective cooling of the first set of circuits on the other side.

A second set of circuit nodes may be formed on the other side of the hyperbolic bicontinuous structure, and a second set of electrically conductive traces may be formed between the second set of circuit nodes. The second set of electrically conductive traces may be formed two-dimensionally on the other side of the hyperbolic bicontinuous surface. The second set of electrically conductive nodes and traces may be effectively three-dimensional circuits formed on the other side of the hyperbolic bicontinuous surface.

The hyperbolic bicontinuous structure may form a plurality of tunnels each delimited by a surface patch, the tunnels connected forming mutually interpenetrating, but otherwise unconnected labyrinths delimited by connected surface patches with no gaps between the patches.

The hyperbolic bicontinuous structure may form a plurality of tunnels each delimited by a surface patch, the tunnels forming mutually interpenetrating, but otherwise unconnected labyrinths, one of the tunnels labyrinths providing the conduit for the coolant.

An optical switch includes a bicontinuous structure containing a plurality of bicontinuous sub-structures, each bicontinuous sub-structure having multiple potential optical entry points and each potential optical entry point having a corresponding primary optical exit point for a given input trajectory.

Each bicontinuous sub-structure may be coated with an electro-optic coating.

Each bicontinuous sub-structure may be coated with an electro-optic coating having reflective properties that change in response to certain light characteristics.

Each bicontinuous sub-structure may be a hyperbolic surface patch.

The bicontinuous sub-structures may be delimit mutually interpenetrating, but otherwise unconnected tunnel labyrinths partitioned by a hyperbolically curved interface.

Each potential optical entry point may be a physical location on the bicontinuous structure.

Each potential optical entry point may correspond to a different angle of incidence at a physical location on the bicontinuous structure.

Each potential optical entry point may be a physical location on the bicontinuous structure and wherein each potential optical entry point corresponds to a different angle of incidence at a physical location on the bicontinuous structure such that the multiple potential optical entry points form a three-dimensional set of potential optical entry points.

The bicontinuous structure may be a gyroid minimal surface.

The bicontinuous structure may be the D or diamond minimal surface.

The bicontinuous structure may be the P minimal surface.

An optical switch includes a plurality of tunnels each delimited by having a surface patch, each surface patch having predetermined reflective properties, the tunnels forming mutually interpenetrating labyrinths, each tunnel representing a set of entry points, each set of entry points having a multitude of entry angles.

Each tunnel may be coated with an electro-optic coating.

Each tunnel may be coated with an electro-optic coating having reflective properties that change in response to certain light characteristics.

Each tunnel may be delimited by surface patches whose points have predominantly hyperbolic curvature.

An optical switching system includes a light source; an optical switch for receiving a light from the light source, the optical switch including a plurality of bicontinuous sub-structures, each bicontinuous sub-structure having multiple potential optical entry points and each potential optical entry point having a corresponding optical exit point for a given input trajectory; and a light collection device for receiving light exiting the optical switch sourced from the laser light beam.

The light source may be a laser.

The light source may be an LED.

The light source may include a light deflection system for physically changing the trajectory or trajectories and entry point or points of the incident light upon the optical switch.

Each bicontinuous sub-structure may be coated with an electro-optic coating.

Each bicontinuous structure may be coated with an electro-optic coating having reflective properties that change in response to certain light characteristics.

Each bicontinuous sub-structure may be a surface patch with points predominantly having hyperbolic curvature.

The bicontinuous structure may form mutually interpenetrating labyrinths where the dividing surface is made up of surface patches with predominantly hyperbolic curvature.

The light source may generate multiple distinct primary light paths through the bicontinuous structure, each path having a distinct primary optical entry point with respect to the optical switch.

The light source may generate multiple distinct light paths through the bicontinuous structure, each light path having a distinct primary optical exit point with respect to the optical switch.

The light source may generate multiple primary light paths through the bicontinuous structure, each path having a distinct optical entry point with respect to the optical switch and a distinct optical exit point with respect to the optical switch.

The light source may generate multiple primary and secondary light paths through the bicontinuous structure, each path having a distinct optical entry point with respect to the optical switch and a distinct optical exit point with respect to the optical switch.

A three-dimensional optical switch includes a plurality of bicontinuous sub-structures; the plurality of bicontinuous sub-structures forming a virtual volume; each bicontinuous sub-structure having an opening; the openings being located around a virtual bounding surface of the virtual volume; each opening having multiple potential optical entry points; each potential optical entry point having a corresponding primary optical exit point for a given input trajectory.

Each bicontinuous sub-structure may be coated with an electro-optic coating.

Each bicontinuous sub-structure may be coated with an electro-optic coating having reflective properties that change in response to certain light characteristics.

Each bicontinuous sub-structure may be a surface patch with predominantly hyperbolic curvature.

The bicontinuous structure may include mutually interpenetrating, otherwise unconnected tunnel labyrinths separated by a hyperbolically curved interface.

Each opening may include potential optical entry points and potential optical exit points.

A three-dimensional circuit includes a plurality of bicontinuous sub-structures; and a plurality of circuit elements; the plurality of circuit elements being formed, in a two-dimensional manner, on the plurality of bicontinuous sub-structures.

Each bicontinuous sub-structure may be a surface patch with predominantly hyperbolic curvature.

The bicontinuous structures may form mutually interpenetrating labyrinths and contain a hyperbolically curved interface.

The plurality of circuit elements may include a plurality of neurons.

The plurality of circuit elements may include a plurality of cardiac cells.

The plurality of circuit elements may include a plurality of retinal cells.

The plurality of circuit elements may include a plurality of muscle cells.

The plurality of circuit elements may include a plurality of isolated electrodes joined by electrically conductive traces each running to the virtual boundary surface of the bicontinuous structure.

The traces may run along shortest pathways to the boundary.

The shortest pathways may be geodesics of the bicontinuous surface.

A three-dimensional circuit includes a plurality of tunnels each delimited by a surface patch, the tunnels forming mutually interpenetrating, but otherwise unconnected tunnel labyrinths; and a plurality of circuit elements; the plurality of circuit elements being formed, in a two-dimensional manner, on the plurality of surface-patch delimited tunnels.

Each tunnel may be delimited by surface patches of predominantly hyperbolic curvature.

The tunnels may form mutually interpenetrating, but otherwise unconnected labyrinths defining a bicontinuous dividing surface containing surface patches with predominantly hyperbolical curvature.

A three-dimensional circuit includes a plurality of bicontinuous sub-structures, the plurality of bicontinuous sub-structures forming a virtual volume, each bicontinuous sub-structure having an opening; and a plurality of circuit elements; the plurality of circuit elements being formed, in a two-dimensional manner, on the plurality of bicontinuous sub-structures.

Each bicontinuous sub structure may have a predominantly hyperbolic curvature.

The bicontinuous sub-structures may form mutually interpenetrating labyrinths and contain a predominantly hyperbolically curved interface.

A three-dimensional circuit includes a hyperbolic bicontinuous structure forming a substrate; a first set of nodes formed on the surface of one side of the hyperbolic bicontinuous structure; and a first set of electrically conductive traces formed between the first set of nodes; the first set of electrically conductive traces being formed two-dimensionally on the side of the surface of the hyperbolic bicontinuous structure; the first set of electrically conductive traces being effectively three-dimensional traces between the first set of nodes.

A coolant may be in contact with the other side of the surface of the hyperbolic bicontinuous structure to provide effective cooling of the first set of circuits.

The three-dimensional circuit may further include a second set of circuits formed on the other side of the surface of the hyperbolic bicontinuous structure; and a second set of electrically conductive traces formed between the second set of nodes; the second set of electrically conductive traces being formed two-dimensionally on other side of the surface of the hyperbolic bicontinuous structure; the second set of electrically conductive traces being effectively three-dimensional traces between the second set of nodes.

The hyperbolic bicontinuous structure may include a plurality of tunnel elements having each delimited by a surface patch with predominantly hyperbolic curvature, the tunnels forming mutually interpenetrating, but otherwise disconnected labyrinths.

The hyperbolic bicontinuous structure may include a plurality of tunnel elements, each delimited by a surface patch with predominantly hyperbolic curvature, the tunnels forming mutually interpenetrating, but otherwise disconnected labyrinths, one of the tunnel labyrinths providing the conduit for the coolant.

While various examples and embodiments have been shown and described, it will be appreciated by those skilled in the art that the spirit and scope of the embodiments are not limited to the specific description and drawings herein.

What is claimed is:

1. An optical switch comprising:
   a bicontinuous structure containing a plurality of bicontinuous sub-structures, each bicontinuous sub-structure having multiple potential optical entry points, each potential optical entry point having a corresponding primary optical exit point for a given input trajectory.

2. The optical switch as claimed in claim 1, wherein each bicontinuous sub-structure is coated with an electro-optic coating.

3. The optical switch as claimed in claim 1, wherein each bicontinuous sub-structure is coated with an electro-optic coating having reflective properties that change in response to certain light characteristics.

4. The optical switch as claimed in claim 1, wherein each bicontinuous sub-structure is a hyperbolic surface patch.

5. The optical switch as claimed in claim 1, wherein the bicontinuous sub-structures delimit mutually interpenetrating, but otherwise unconnected tunnel labyrinths partitioned by a hyperbolically curved interface.

6. The optical switch as claimed in claim 1, wherein each potential optical entry point is a physical location on said bicontinuous structure.

7. The optical switch as claimed in claim 1, wherein each potential optical entry point corresponds to a different angle of incidence at a physical location on said bicontinuous structure.

8. The optical switch as claimed in claim 1, wherein each potential optical entry point is a physical location on the bicontinuous structure and wherein each potential optical entry point corresponds to a different angle of incidence at a physical location on the bicontinuous structure such that the multiple potential optical entry points form a three-dimensional set of potential optical entry points.

9. The optical switch as claimed in claim 1, wherein the bicontinuous structure is the gyroid minimal surface.

10. The optical switch as claimed in claim 1, wherein bicontinuous structure is the D or diamond minimal surface.

11. The optical switch as claimed in claim 1, wherein the bicontinuous structure is the P minimal surface.

12. An optical switch comprising a plurality of tunnels each delimited by having a surface patch, each surface patch having predetermined reflective properties, the tunnels forming mutually interpenetrating labyrinths, each tunnel representing a set of entry points, each set of entry points having a multitude of entry angles.

13. The optical switch as claimed in claim 12, wherein each tunnel is coated with an electro-optic coating.

14. The optical switch as claimed in claim 12, wherein each tunnel is coated with an electro-optic coating having reflective properties that change in response to certain light characteristics.

15. The optical switch as claimed in claim 12, wherein each tunnel is delimited by surface patches whose points have predominantly hyperbolic curvature.

16. An optical switching system comprising:
a light source;
an optical switch for receiving a light from the light source, said optical switch including a plurality of bicontinuous sub-structures, each bicontinuous sub-structure having multiple potential optical entry points and each potential optical entry point having a corresponding optical exit point for a given input trajectory; and
a light collection device for receiving light exiting said optical switch sourced from the laser light beam.

17. An optical switching system as claimed in claim 16, wherein the light source is a laser.

18. An optical switching system as claimed in claim 16, wherein the light source is an LED.

19. The optical switching system as claimed in claim 16, wherein the light source includes a light deflection system for physically changing the trajectory or trajectories and entry point or points of the incident light upon the optical switch.

20. The optical switching system as claimed in claim 16, wherein each bicontinuous sub-structure is coated with an electro-optic coating.

21. The optical switching system as claimed in claim 16, wherein each bicontinuous structure is coated with an electro-optic coating having reflective properties that change in response to certain light characteristics.

22. The optical switching system as claimed in claim 16, wherein each bicontinuous sub-structure is a surface patch with points predominantly having hyperbolic curvature.

23. The optical switching system as claimed in claim 16, wherein said bicontinuous structure forms mutually interpenetrating labyrinths where the dividing surface is made up of surface patches with predominantly hyperbolic curvature.

24. The optical switching system as claimed in claim 16, wherein the light source generates multiple distinct primary light paths through the bicontinuous structure, each path having a distinct primary optical entry point with respect to said optical switch.

25. The optical switching system as claimed in claim 16, wherein the light source generates multiple distinct light paths through the bicontinuous structure, each light path having a distinct primary optical exit point with respect to said optical switch.

26. The optical switching system as claimed in claim 16, wherein the light source generates multiple primary light paths through the bicontinuous structure, each path having a distinct optical entry point with respect to said optical switch and a distinct optical exit point with respect to said optical switch.

27. The optical switching system as claimed in claim 16, wherein the light source generates multiple primary and secondary light paths through the bicontinuous structure, each path having a distinct optical entry point with respect to said optical switch and a distinct optical exit point with respect to said optical switch.

* * * * *